(12) United States Patent
Kwon et al.

(10) Patent No.: US 12,387,771 B2
(45) Date of Patent: *Aug. 12, 2025

(54) MEMORY DEVICE FOR SUPPORTING NEW COMMAND INPUT SCHEME AND METHOD OF OPERATING THE SAME

(71) Applicant: SAMSUNG ELECTRONICS CO., LTD., Suwon-si (KR)

(72) Inventors: Youngcheon Kwon, Hwaseong-si (KR); Jemin Ryu, Seoul (KR); Jaeyoun Youn, Suwon-si (KR); Haesuk Lee, Seongnam-si (KR); Jihyun Choi, Daegu (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 0 days.

This patent is subject to a terminal disclaimer.

(21) Appl. No.: 18/654,443

(22) Filed: May 3, 2024

(65) Prior Publication Data

US 2024/0282353 A1    Aug. 22, 2024

Related U.S. Application Data

(63) Continuation of application No. 18/299,440, filed on Apr. 12, 2023, now Pat. No. 12,002,543, which is a
(Continued)

(30) Foreign Application Priority Data

Jan. 21, 2020  (KR) .................. 10-2020-0008110
Aug. 18, 2020  (KR) .................. 10-2020-0103438

(51) Int. Cl.
*G11C 7/22*     (2006.01)
*G11C 7/10*     (2006.01)

(52) U.S. Cl.
CPC ............ *G11C 7/222* (2013.01); *G11C 7/1048* (2013.01); *G11C 7/1057* (2013.01); *G11C 7/1084* (2013.01)

(58) Field of Classification Search
CPC ..... G11C 7/222; G11C 7/1048; G11C 7/1057; G11C 7/1084; G11C 8/08; G11C 11/4076; G06F 13/382; G06F 13/4291
(Continued)

(56) References Cited

U.S. PATENT DOCUMENTS 6,279,116 B1    8/2001  Lee
6,510,095 B1    1/2003  Matsuzaki et al.
(Continued)

FOREIGN PATENT DOCUMENTS

TW    201145786 A    12/2011
TW    201941013 A    10/2019

OTHER PUBLICATIONS

Communication dated May 31, 2021, from the European Patent Office in European Application No. 21152630.6.
(Continued)

*Primary Examiner* — Huan Hoang
(74) *Attorney, Agent, or Firm* — Sughrue Mion, PLLC

(57) ABSTRACT

A method of operating a memory device including row pins and column pins includes receiving a first active command through the row pins during 1.5 cycles of a clock signal, receiving a first read command or a first write command through the column pins during 1 cycle of the clock signal, receiving a first precharge command through the row pins during a 0.5 cycle of the clock signal corresponding to a rising edge of the clock signal, receiving a second active command through the row pins during the 1.5 cycles of the clock signal, receiving a second read command or a second write command through the column pins during the 1 cycle
(Continued)

of the clock signal, and receiving a second precharge command through the row pins during the 0.5 cycle of the clock signal corresponding to a falling edge of the clock signal.

20 Claims, 22 Drawing Sheets

Related U.S. Application Data continuation of application No. 17/574,174, filed on Jan. 12, 2022, now Pat. No. 11,636,885, which is a continuation of application No. 17/145,941, filed on Jan. 11, 2021, now Pat. No. 11,250,894.

(58) Field of Classification Search
USPC ........................................... 365/233.1
See application file for complete search history.

(56) References Cited

U.S. PATENT DOCUMENTS

| | | | |
|---|---|---|---|
| 6,717,884 B2 | 4/2004 | Kim | |
| 7,299,329 B2 | 11/2007 | Choi et al. | |
| 7,433,258 B2 | 10/2008 | Rao et al. | |
| 8,059,484 B2 | 11/2011 | Yoko | |
| 8,497,666 B2 | 7/2013 | Nagasawa | |
| 9,064,560 B2 | 6/2015 | Qawami et al. | |
| 10,579,263 B2 | 3/2020 | Shin et al. | |
| 11,025,232 B2 | 6/2021 | Scolari et al. | |
| 11,250,894 B2 | 2/2022 | Kwon et al. | |
| 11,386,885 B2 | 7/2022 | Chatterjee et al. | |
| 11,636,885 B2 * | 4/2023 | Kwon | G11C 7/1057 365/233.1 |
| 12,002,543 B2 * | 6/2024 | Kwon | G11C 11/4076 |
| 2002/0041536 A1 | 4/2002 | Tomita | |
| 2002/0064083 A1 | 5/2002 | Ryu et al. | |
| 2002/0116657 A1 | 8/2002 | Uchida | |
| 2009/0296514 A1 | 12/2009 | Yeh | |
| 2013/0238841 A1 | 9/2013 | Kim | |
| 2013/0254475 A1 | 9/2013 | Perego et al. | |
| 2015/0187403 A1 | 7/2015 | Kim et al. | |
| 2016/0086644 A1 * | 3/2016 | Hong | G11C 7/1087 365/230.03 |

OTHER PUBLICATIONS

Communication issued Dec. 27, 2021 by the Taiwanese Patent Office in Taiwanese Patent Application No. 110102104.

Office Action issued on Jun. 11, 2025 by the Chinese Patent Office in corresponding CN Patent Application No. 202110072030.3.

* cited by examiner

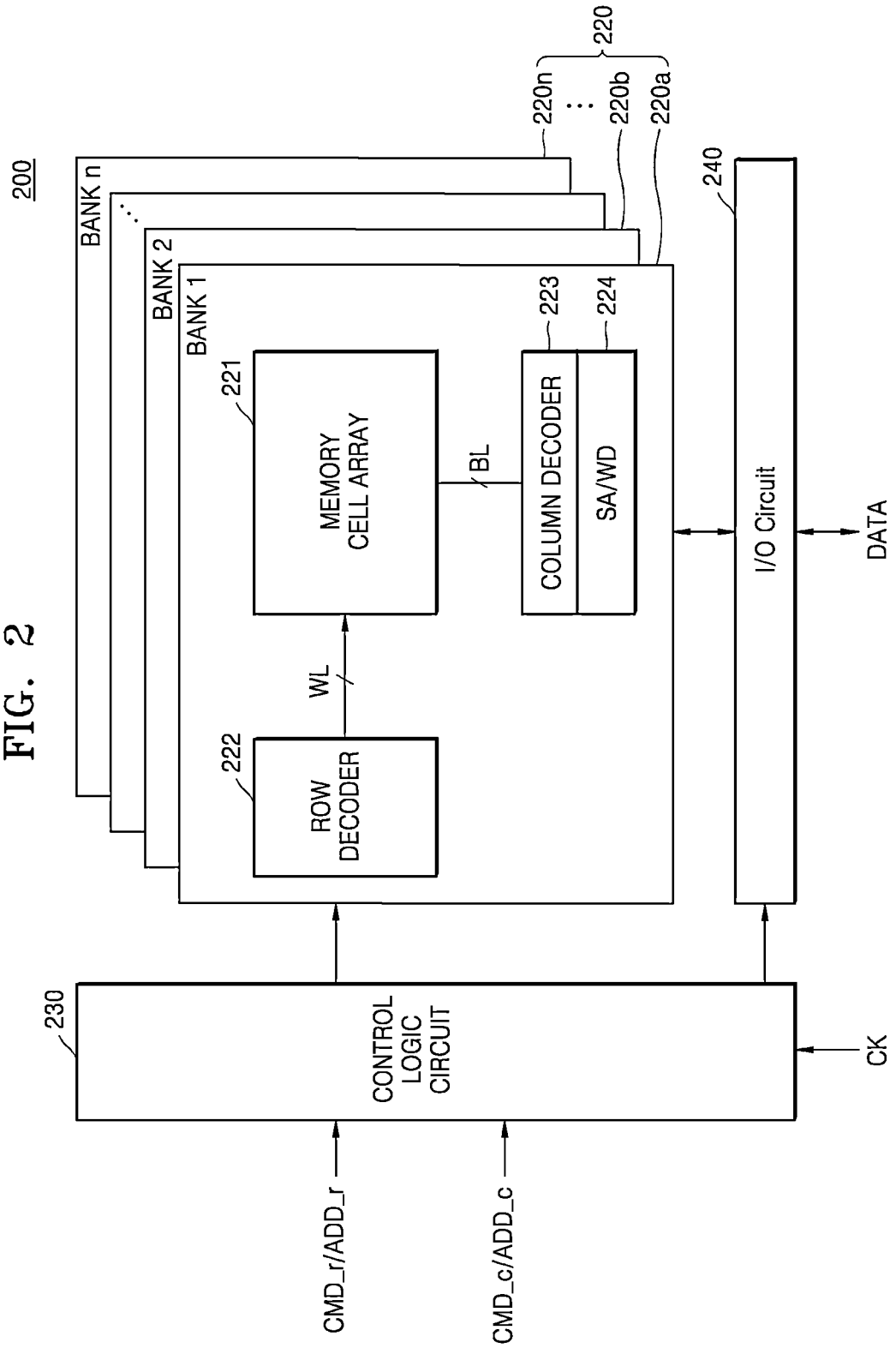

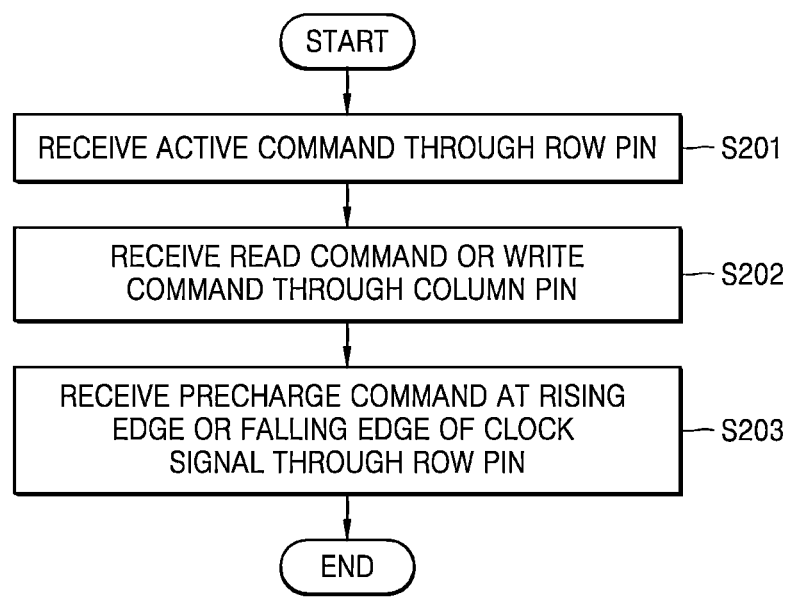

FIG. 12A

| ROW COMMAND | CLOCK CYCLE | R_P0 | R_P1 | R_P2 | R_P3 | R_P4 | R_P5 | R_P6 | R_P7 | R_P8 | R_P9 |
|---|---|---|---|---|---|---|---|---|---|---|---|
| RNOP | R or F | H | H | H | H | V | V | V | V | V | V |
| ACT | R | L | H | H | PC | SID0/V | SID1/V | BA0 | BA1 | BA2 | BA3 |
|  | F | H | H | RA8 | RA9 | RA10 | RA11 | RA12 | RA13/V | RA14/V | RA15/V |
|  | R | H | H | RA0 | RA1 | RA2 | RA3 | RA4 | RA5 | RA6 | RA7 |
| PREpb | R or F | H | L | L | PC | SID0/V | SID1/V | BA0 | BA1 | BA2 | BA3 |
| PREab | R or F | H | L | H | PC | V | V | V | V | V | V |
| REFpb | R | L | L | L | PC | SID0/V | SID1/V | BA0 | BA1 | BA2 | BA3 |
| REFab | R | H | H | L | PC | V | V | V | V | L | V |
| RFMpb | R | L | L | H | PC | SID0/V | SID1/V | BA0 | BA1 | BA2 | BA3 |
| RFMab | R | H | H | L | PC | V | V | V | V | H | V |
| PDE | R | L | H | L | H | V | V | V | V | V | V |
|  | F | L | H | L | H | V | V | V | V | V | V |
| SRE | R | L | H | L | L | V | V | V | V | V | V |
|  | F | L | H | L | L | V | V | V | V | V | V |
| PDX/SRX | R | H | H | H | H | V | V | V | V | V | V |

FIG. 12B

| COLUMN COMMAND | CLOCK CYCLE | C_P0 | C_P1 | C_P2 | C_P3 | C_P4 | C_P5 | C_P6 | C_P7 |
|---|---|---|---|---|---|---|---|---|---|
| CNOP | R | H | H | H | V | V | V | V | V |
|  | F | V | V | V | V | V | V | V | V |
| RD | R | H | L | H | L | PC | SID0/V | SID1/V | BA0 |
|  | F | BA1 | BA2 | BA3 | CA0 | CA1 | CA2 | CA3 | CA4 |
| RDA | R | H | L | H | H | PC | SID0/V | SID1/V | BA0 |
|  | F | BA1 | BA2 | BA3 | CA0 | CA1 | CA2 | CA3 | CA4 |
| WR | R | H | L | L | L | PC | SID0/V | SID1/V | BA0 |
|  | F | BA1 | BA2 | BA3 | CA0 | CA1 | CA2 | CA3 | CA4 |
| WRA | R | H | L | L | H | PC | SID0/V | SID1/V | BA0 |
|  | F | BA1 | BA2 | BA3 | CA0 | CA1 | CA2 | CA3 | CA4 |
| MRS | R | L | L | L | MA4 | OP5 | OP6 | OP7 | MA0 |
|  | F | MA1 | MA2 | MA3 | OP0 | OP1 | OP2 | OP3 | OP4 |
| MRR | R | L | L | H | MA4 | V | V | V | MA0 |
|  | F | MA1 | MA2 | MA3 | V | V | V | V | V |

MEMORY DEVICE FOR SUPPORTING NEW COMMAND INPUT SCHEME AND METHOD OF OPERATING THE SAME

CROSS-REFERENCE TO RELATED APPLICATIONS

This is a Continuation of U.S. application Ser. No. 18/299,440 filed Apr. 12, 2023, which is a Continuation of U.S. application Ser. No. 17/574,174 filed Jan. 12, 2022, which is a Continuation Application of U.S. patent application Ser. No. 17/145,941 filed Jan. 11, 2021, which claims priority under 35 U. S. C. § 119 to Korean Patent Application No. 10-2020-0008110 and Korean Patent Application No. 10-2020-0103438 filed on Jan. 21, 2020, and Aug. 18, 2020, respectively, in the Korean Intellectual Property Office, the disclosures of which are incorporated by reference herein in their entirety.

BACKGROUND

The inventive concept relates to a semiconductor device, and more particularly, to a memory device for supporting a new command input scheme and a method of operating the same.

Electronic devices such as a smart phone, a graphic accelerator, and an artificial intelligence (AI) accelerator process data by using a memory device such as dynamic random access memory (DRAM). As an amount of data to be processed by an electronic device increases, a memory device having high capacity and bandwidth is required. In particular, in order to process data at a high speed, use of a memory device providing high throughput input and output of a multichannel interface method such as a high bandwidth memory (HBM) standard is increasing. As the use of such memory device increases, an efficient input and output interface method is required between a host device (e.g., a memory controller) and the memory device.

SUMMARY

According to an aspect of the inventive concept, there is provided a method of operating a memory device including row pins for receiving row commands and column pins for receiving column commands different from the row commands. The method includes receiving a first active command for one memory bank through the row pins during one and half (1.5) cycles of a clock signal, receiving a first read command or a first write command for the one memory bank through the column pins during one (1) cycle of the clock signal after receiving the first active command, receiving a first precharge command for the one memory bank through the row pins during a half (0.5) cycle of the clock signal corresponding to a rising edge of the clock signal after receiving the first read command or the first write command, receiving a second active command for the one memory bank through the row pins during the 1.5 cycles of the clock signal, receiving a second read command or a second write command for the one memory bank through the column pins during the 1 cycle of the clock signal after receiving the second active command, and receiving a second precharge command for the one memory bank through the row pins during the 0.5 cycle of the clock signal corresponding to a falling edge of the clock signal after receiving the second read command or the second write command.

According to an aspect of the inventive concept, there is provided a memory device including a clock pin receiving a clock signal, row pins receiving row commands, column pins receiving column commands different from the row commands, and an interface circuit receiving a first active command through the row pins during 1.5 cycles among 2 cycles of the clock signal, receiving a first precharge command during a remaining 0.5 cycle corresponding to a falling edge of the clock signal, receiving a first write command or a first read command through the column pins during 1 cycle among the 2 cycles, and receiving a second write command or a second read command during the remaining 1 cycle.

According to an aspect of the inventive concept, there is provided a memory device including a clock pin receiving a clock signal, row pins receiving row commands, column pins receiving column commands different from the row commands, and an interface circuit receiving a first row command at a first rising edge of the clock signal and a second row command at a first falling edge of the clock signal through the row pins in a first period including the first rising edge and the first falling edge of the clock signal, receiving a first column command through the column pins in the first period, receiving a third row command at a second rising edge of the clock signal and a fourth row command at a second falling edge of the clock signal through the row pins in a second period including the second rising edge and the second falling edge of the clock signal, and receiving a second column command through the column pins in the second period. The second row command and the third row command are specific commands representing the same operation.

BRIEF DESCRIPTION OF THE DRAWINGS

Example embodiments of inventive concepts will be more clearly understood from the following detailed description taken in conjunction with the accompanying drawings in which:

FIG. 2 is a block diagram of the memory device of FIG. 1 according to an example embodiment;

FIG. 5 is a flowchart illustrating an operation of the memory device of FIG. 1 according to an example embodiment;

FIG. 12A is a table illustrating a row command according to an example embodiment;

FIG. 12B is a table illustrating an example of a column command according to an example embodiment;

DETAILED DESCRIPTION OF THE EMBODIMENTS

Hereinafter, example embodiments of the inventive concepts will be described so that those skilled in the art may easily perform the inventive concepts.

Figure 1:
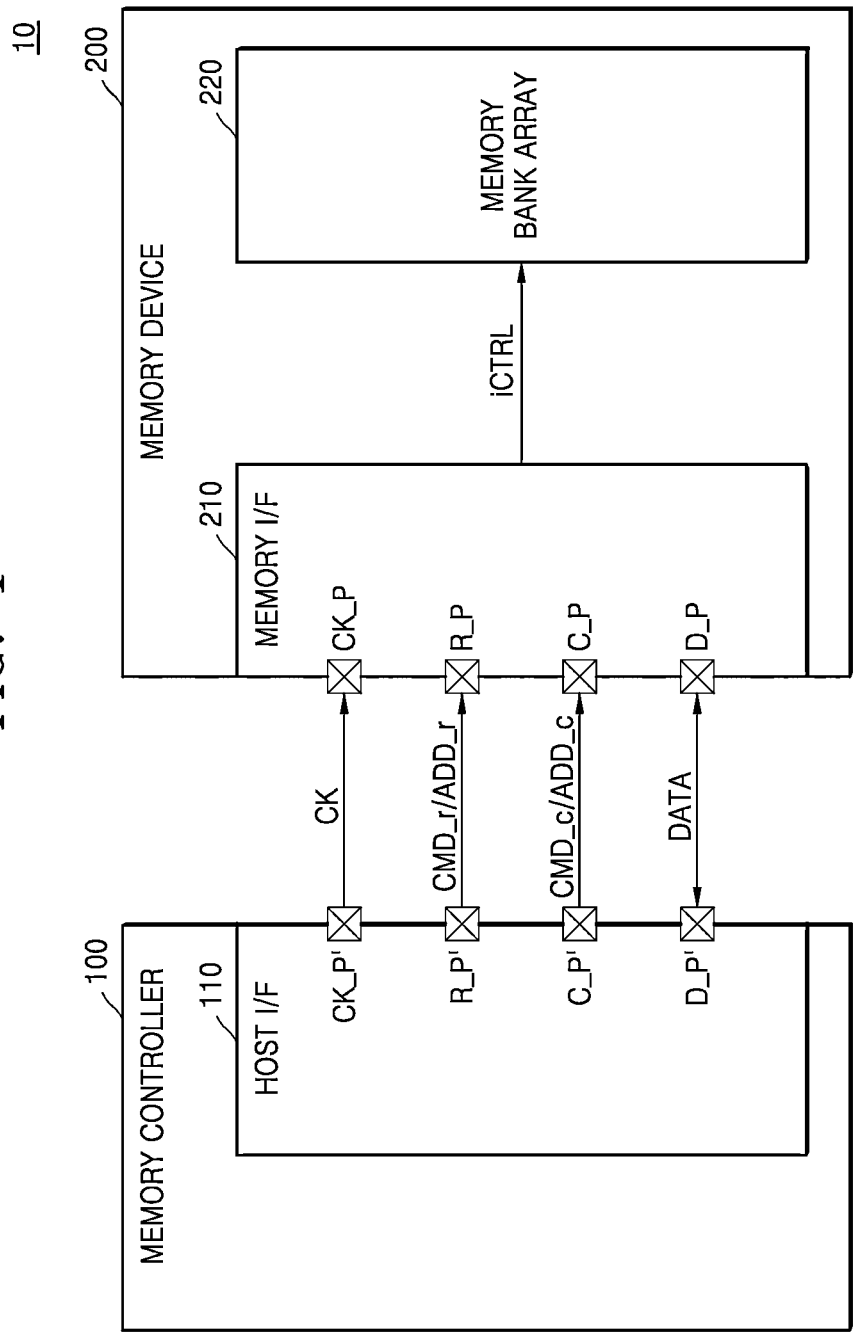
FIG. 1 is a block diagram illustrating a memory system according to an example embodiment.

FIG. 1 is a block diagram illustrating a memory system 10 according to an example embodiment. Referring to FIG. 1, the memory system 10 may include a memory controller 100 and a memory device 200. The memory controller 100 may control an overall operation of the memory device 200. The memory controller 100 may control the memory device 200 so that data is output from or stored in the memory device 200 and may be implemented as a part of a system-on-chip (SoC). However, the example embodiment is not limited thereto.

The memory controller 100 may include a host interface circuit 110 and a clock pin CK_P', a row pin R_P', a column pin C_P', and a data pin D_P'. The host interface circuit 110 may transmit a clock signal CK to the memory device 200 through the clock pin CK_P'. The clock signal CK may periodically toggle between a high level and a low level. For example, the clock signal CK may be a differential signal that is one of a differential pair.

The host interface circuit 110 may transmit a row command CMD_r and/or a row address ADD_r (hereinafter, referred to as a row command/row address CMD_r/ADD_r) to the memory device 200 through the row pin R_P'. For example, the row command CMD_r may include an active command ACT and a precharge command PRE. For example, the row address ADD_r may include a bank address corresponding to the row command CMD_r. The host interface circuit 110 may transmit the row command/row address CMD_r/ADD_r to the memory device 200 based on toggle timings of the clock signal CK.

The host interface circuit 110 may transmit a column command CMD_c and/or a column address ADD_c (hereinafter, referred to as a column command/column address CMD_c/ADD_c) to the memory device 200 through the column pin C_P'. For example, the column command CMD_c may include a read command RD and a write command WR. The row command CMD_r and the column command CMD_c may include different commands. For example, the column address ADD_c may include a bank address corresponding to the column command CMD_c. The host interface circuit 110 may transmit the column command/column address CMD_c/ADD_c to the memory device 200 based on the toggle timings of the clock signal CK.

The host interface circuit 110 may transmit data DATA to the memory device 200 through the data pin D_P'. The host interface circuit 110 may transmit the data DATA to the memory device 200 based on toggle timings of an additional data clock signal (e.g., a write data strobe signal WDQS). The host interface circuit 110 may receive the data DATA from the memory device 200 through the data pin D_P'.

The memory device 200 may operate in accordance with control of the memory controller 100. For example, the memory device 200 may output the stored data in accordance with the control of the memory controller 100 or may store the data received from the memory controller 100.

The memory device 200 may include a memory interface circuit 210 and a memory bank array 220. The memory device 200 may further include a clock pin CK_P, a row pin R_P, a column pin C_P, and a data pin D_P corresponding to the clock pin CK_P', the row pin R_P', the column pin C_P', and the data pin D_P' of the memory controller 100. The memory interface circuit 210 may receive the clock signal CK from the memory controller 100 through the clock pin CK_P.

The memory interface circuit 210 may receive the row command/row address CMD_r/ADD_r from the memory controller 100 through the row pin R_P. For example, the memory interface circuit 210 may sample the row command/row address CMD_r/ADD_r based on the toggle timings of the clock signal CK. According to an example embodiment, the row command/row address CMD_r/ADD_r may be transmitted to the memory device 200 through a plurality of signal lines. In this case, the row pin R_P may include a plurality of pins corresponding to the plurality of signal lines. For example, the row pin R_P may include 10 pins. However, the inventive concept is not limited thereto.

The memory interface circuit 210 may receive the column command/column address CMD_c/ADD_c from the memory controller 100 through the column pin C_P. For example, the memory interface circuit 210 may sample the column command/column address CMD_c/ADD_c based on the toggle timings of the clock signal CK. According to an example embodiment, the column command/column address CMD_c/ADD_c may be transmitted to the memory device 200 through the plurality of signal lines. In this case, the column pin C_P may include a plurality of pins corresponding to the plurality of signal lines. For example, the column pin C_P may include 8 pins. However, the inventive concept is not limited thereto.

The memory interface circuit 210 may receive the data DATA from the memory controller 100 through the data pin D_P. The memory interface circuit 210 may sample the data DATA based on the toggle timings of the additional data clock signal (e.g., the write data strobe signal WDQS). The memory interface circuit 210 may transmit the data DATA to the memory controller 100 through the data pin D_P. For example, the memory interface circuit 210 may transmit the data DATA to the memory controller 100 based on the toggle timings of the additional data clock signal (e.g., the write data strobe signal WDQS). According to an example embodiment, the data DATA may be received by or transmitted from the memory device 200 through the plurality of signal lines. In this case, the data pin D_P may include a plurality of pins corresponding to the plurality of signal lines. For example, the data pin D_P may include 64 or 128 pins. However, the inventive concept is not limited thereto.

The memory interface circuit 210 may generate a control signal iCTRL based on the row command CMD_r and the column command CMD_c that are received from the memory controller 100 and may control operations of memory banks of a memory bank array 220 based on the control signal iCTRL.

The memory bank array 220 may include one or more memory banks. The memory bank may include a plurality of memory cells connected to word lines and bit lines. For example, the plurality of memory cells may be dynamic random access memory (DRAM) cells. In this case, the host interface circuit 110 and the memory interface circuit 210 may communicate with input and output signals based on one of the standards such as a double data rate (DDR) standard, a low power double data rate (LPDDR) standard, a graphics double data rate (GDDR) standard, a wide I/O standard, a high bandwidth memory (HBM) standard, and a hybrid memory cube (HMC) standard. However, the inventive concept is not limited thereto. Memory cells may be at least one of various memory cells such as static RAM (SRAM), phase-change RAM (PRAM), magnetic RAM (MRAM), resistive RAM (RRAM), and ferroelectric RAM (FRAM).

The memory banks of the memory bank array 220 may write or read the data DATA in or from the memory cells in response to the control signal iCTRL.

According to an example embodiment, the host interface circuit 110 may transmit a specific command (e.g., a precharge command PRE) of the row command CMD_r at a rising and/or falling edge of the clock signal CK. The host interface circuit 110 may start to transmit the specific command at the timing corresponding to the rising and/or falling edge of the clock signal CK. For example, the host interface circuit 110 may transmit the specific command at a timing corresponding to the rising edge of the clock signal CK in a first time period and may transmit the specific command at a timing corresponding to the falling edge of the clock signal CK in a second time period. The host interface circuit 110 may transmit a remaining command excluding the specific command of the row command CMD_r and the column command CMD_c at the rising edge of the clock signal CK. The host interface circuit 110 may start to transmit the remaining command of the row command CMD_r and the column command CMD_c at a timing corresponding to the rising edge of the clock signal CK.

According to an example embodiment, the memory interface circuit 210 may sense the specific command although the specific command is transmitted from the memory controller 100 at any timing. Although the specific command is received at the timing corresponding to the rising and/or falling edge of the clock signal CK, the memory interface circuit 210 may sense the specific command. For example, the memory interface circuit 210 may sense the specific command transmitted at each of two timings by decoding the row command CMD_r.

Hereinafter, for convenience sake, that the specific command is transmitted or received at the rising and/or falling edge of the clock signal CK may mean that the specific command starts to be transmitted or received at the timing corresponding to the rising and/or falling edge of the clock signal CK.

FIG. 2 is an example block diagram of the memory device 200 of FIG. 1. Referring to FIG. 2, the memory device 200 may include a memory bank array 220, a control logic circuit 230, and an input and output circuit 240. The memory bank array 220 may include a plurality of memory banks 220a to 220n. Each of the plurality of memory banks 220a to 220n may include a memory cell array 221, a row decoder 222, a column decoder 223, and a sense amplifier/write driver 224. The control logic circuit 230 and the input and output circuit 240 may be included in the memory interface circuit 210 of FIG. 1. However, the inventive concept is not limited thereto. The control logic circuit 230 and the input and output circuit 240 may be provided as separate circuits.

According to an example embodiment, the plurality of memory banks 220a to 220n may be divided into a plurality of bank groups. For example, each bank group may include 4 memory banks. However, the inventive concept is not limited thereto. When the plurality of memory banks 220a to 220n are divided into the plurality of bank groups, timing parameters for accessing within the same bank group may be set to be different from timing parameters for accessing to different bank groups.

The memory cell array 221 may include a plurality of memory cells. The plurality of memory cells may be formed at points at which the word lines WL intersect with the bit lines BL.

The row decoder 222 may be connected to the memory cell array 221 through the word lines WL. The row decoder 222 may control voltages of the word lines WL in response to control of the control logic circuit 230.

The column decoder 223 may be connected to the cell array 221 through the bit lines BL. The column decoder 223 may select at least one of the bit lines BL in response to the control of the control logic circuit 230. The sense amplifier/write driver 224 may sense or control a voltage or current of the bit line selected by the column decoder 223.

The control logic circuit 230 may receive the row command/row address CMD_r/ADD_r and the column command/column address CMD_c/ADD_c from the memory controller 100 of FIG. 1. The control logic circuit 230 may decode the row command/row address CMD_r/ADD_r and the column command/column address CMD_c/ADD_c. According to an example embodiment, the control logic circuit 230 may decode the row command CMD_r through a row command decoder and may decode the column command CMD_c through a column command decoder. For example, the control logic circuit 230 may sense the active command ACT or the precharge command PRE by decoding the row command CMD_r. The control logic circuit 230 may sense the write command WR or the read command RD by decoding the column command CMD_c.

The control logic circuit 230 may generate control signals for controlling the plurality of memory banks 220a to 220n based on the decoding result. For example, when the active command ACT is sensed, the control logic circuit 230 may generate a control signal for activating a specific word line of a specific memory bank. In this case, the specific word line of the specific memory bank may be activated in accordance with the row address ADD_r corresponding to the active command ACT. For example, when the precharge command PRE is sensed, the control logic circuit 230 may generate a control signal for precharging at least one memory bank. In this case, in accordance with the row address ADD_r corresponding to the precharge command PRE, the specific memory bank or all memory banks may be precharged. For example, when the write command WR or the read command RD is sensed, the control logic circuit 230 may generate a control signal so as to write or read the data DATA in or from the specific memory bank. In this case, in accordance with the column address ADD_c corresponding to the write command WR or the read command RD, the data DATA may be written in or read from a memory cell corresponding to the column address ADD_c.

According to an example embodiment, the control logic circuit 230 may include a specific command decoding circuit for decoding a specific command (e.g., the precharge command PRE) received at the rising and/or falling edge of the clock signal CK in the row command CMD_r. Accordingly, the control logic circuit 230 may sense the specific command although the row command CMD_r representing the specific command is received at any timing.

The input and output circuit 240 may transmit and receive the data DATA to and from an external device (e.g., the memory controller 100) through a plurality of data lines. The input and output circuit 240 may include an input and output buffer for temporarily storing read data provided from the plurality of memory banks 220a to 220n and write data provided from the external device.

Figure 3A:
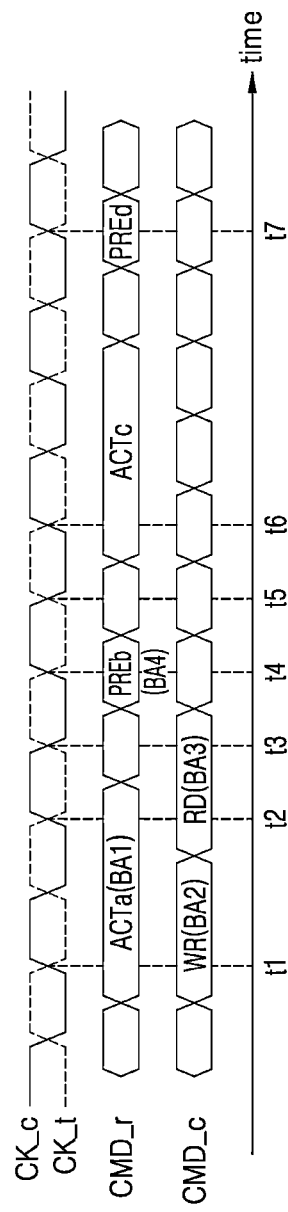
FIGS. 3A to 3C illustrate examples of a timing diagram in which the memory device of FIG. 1 receives commands according to example embodiment.
Figure 3B:
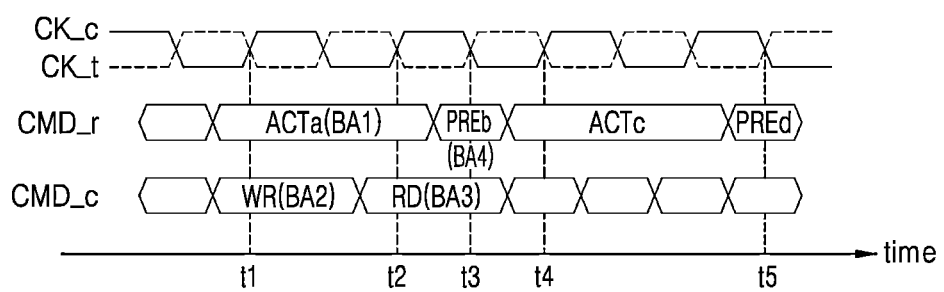
Figure 3C:
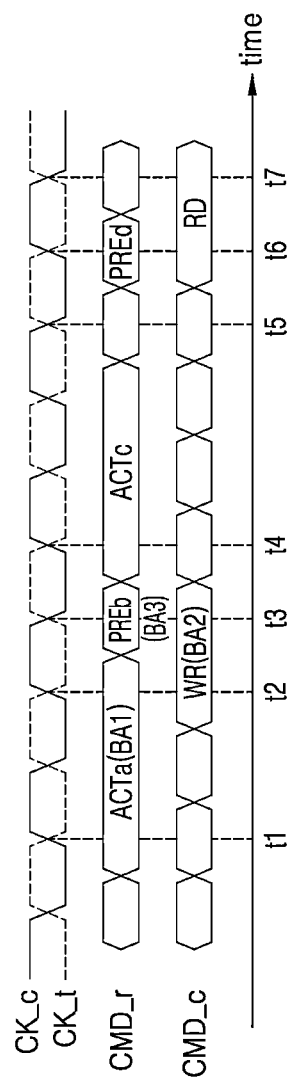

FIGS. 3A to 3C illustrate examples of a timing diagram in which the memory device of FIG. 1 receives commands according to example embodiments. Specifically, FIG. 3A is a timing diagram illustrating that the precharge command PRE is received at the rising edge of the clock signal CK_c and FIG. 3B is a timing diagram illustrating that the precharge command PRE is received at the falling edge of the clock signal CK_c. FIG. 3C is a timing diagram illustrating that the precharge command PRE is received at the rising and falling edge of the clock signal CK_c.

Referring to FIGS. 3A to 3C, clock signals CK_c and CK_t are received through two signal lines as a differential pair. For example, the clock signal CK_c may correspond to the clock signal CK of FIG. 1. The row command CMD_r and the column command CMD_c are received based on toggle timings of the clock signals CK_c and CK_t. The active command ACT and the precharge command PRE are received as the row command CMD_r and the write command WR, and the read command RD are received as the column command CMD_c. The active command ACT is received during 1.5 cycles corresponding to two rising edges and one falling edge of the clock signal CK_c, and the precharge command PRE is received during a 0.5 cycle corresponding to one rising edge or one falling edge of the clock signal CK_c. The write command WR and the read command RD are received during 1 cycle corresponding to one rising edge and one falling edge of the clock signal CK_c.

Referring to FIGS. 1 and 3A, the memory device 200 may receive an active command ACTa and the write command WR at a first point in time t1 corresponding to the rising edge of the clock signal CK_c. The memory device 200 may receive the active command ACTa and the write command WR in parallel at the first point in time t1. In this case, a bank address corresponding to the active command ACTa may be different from a bank address corresponding to the write command WR. For example, the active command ACTa may correspond to a first bank address BA1, the write command WR may correspond to a second bank address BA2. Because the active command ACTa is received during the 1.5 cycles, the active command ACTa may be received until a second point in time t2.

The memory device 200 may receive the read command RD at the second point in time t2. The memory device 200 may receive the active command ACTa and the read command RD in parallel at the second point in time t2. In this case, the bank address corresponding to the active command ACTa may be different from a bank address corresponding to the read command RD. For example, the active command ACTa may correspond to a first bank address BA1, the read command RD may correspond to a third bank address BA3.

As illustrated in FIG. 3A, when the read command RD is received without delay after the write command WR is completely received (i.e., when a time interval between the write command WR and the read command RD is 1 tCK (i.e., 1 cycle of the clock signal CK_c)), the bank address corresponding to the write command WR may be different from the bank address corresponding to the read command RD. For example, the write command WR may correspond to a second bank address BA2, and the read command RD may correspond to a third bank address BA3. For example, when the memory banks are divided into the plurality of bank groups, a bank group corresponding to the write command WR may be different from a bank group corresponding to the read command RD. Accordingly, the bank addresses corresponding to the active command ACTa, the write command WR, and the read command RD may be different from one another.

The memory device 200 may not receive the row command CMD_r representing a specific operation at a third point in time t3 corresponding to the falling edge of the clock signal CK_c. For example, the memory device 200 may receive a no operation row command (e.g., RNOP of FIG. 12A) representing a no operation at the third point in time t3.

The memory device 200 may receive a precharge command PREb at a fourth point in time t4 corresponding to the rising edge of the clock signal CK_c. After the active command ACTa is completely received, the precharge command PREb may be received with delay of the 0.5 cycle. In this case, the bank address corresponding to the active command ACTa may be different from a bank address corresponding to the precharge command PREb. For example, the active command ACTa may correspond to a first bank address BA1, and the precharge command PREb may correspond to a fourth bank address BA4. However, the inventive concept is not limited thereto. The precharge command PREb may correspond to the second bank address BA2 corresponding to the write command WR received at the first point in time t1 or the third bank address BA3 corresponding to the read command RD received at the second point in time t2.

The memory device 200 may not receive the row command CMD_r representing a specific operation at a fifth point in time t5 corresponding to the falling edge of the clock signal CK_c. For example, the memory device 200 may receive the no operation row command RNOP at the fifth point in time t5. The memory device 200 may receive an active command ACTc at a sixth point in time t6 corresponding to the rising edge of the clock signal CK_c and may receive a precharge command PREd at a seventh point in time t7 corresponding to the rising edge of the clock signal CK_c.

As described above, when the precharge command PRE is received at the rising edge of the clock signal CK_c, the precharge command PRE may be received with delay (e.g. 0.5 cycle) after the active command ACT is completely received.

Referring to FIGS. 1 and 3B, the memory device 200 may receive the active command ACTa and the write command WR at the first point in time t1 corresponding to the rising edge of the clock signal CK_c and may receive the active command ACTa and the read command RD at the second point in time t2.

The memory device 200 may receive the precharge command PREb at the third point in time t3 corresponding to the falling edge of the clock signal CK_c. After the active command ACTa is completely received, the precharge command PREb may be received without delay. Therefore, at the third point in time t3, the precharge command PREb and the read command RD may be received in parallel.

According to example embodiment of FIG. 3B, the bank address corresponding to the active command ACTa may be different from the bank address corresponding to the write command WR. In addition, the bank address corresponding to the active command ACTa, the bank address corresponding to the precharge command PREb, and the bank address corresponding to the read command RD may be different from one another. For example, the active command ACTa may correspond to the first bank address BA1, the write command WR may correspond to the second bank address BA2, the read command RD may correspond to the third bank address BA3, and the precharge command PREb may correspond to the fourth bank address BA4. However, the inventive concept is not limited thereto. The precharge command PREb may correspond to the second bank address BA2 corresponding to the write command WR received at the first point in time t1.

After the precharge command PREb is completely received, the memory device 200 may receive the active command ACTc at the fourth point in time t4 corresponding to the rising edge of the clock signal CK_c without delay. After the active command ACTc is completely received, the memory device 200 may receive the precharge command PREd at the fifth point in time t5 corresponding to the falling edge of the clock signal CK_c without delay.

As described above, when the precharge command PRE is received at the falling edge of the clock signal CK_c, the precharge command PRE may be received without delay after the active command ACT is completely received.

Referring to FIGS. 1 and 3C, the memory device 200 may receive the active command ACTa from the first point in time t1 corresponding to the rising edge of the clock signal CK_c to the second point in time t2. The memory device 200 may receive the write command WR from the second point in time t2 to the third point in time t3. The memory device 200 may receive the precharge command PREb at the third point in time t3 corresponding to the falling edge of the clock signal CK_c. Accordingly, during the 1 cycle of the clock signal CK_c corresponding to the second point in time t2 and the third point in time t3, the active command ACTa, the precharge command PREb, and the write command WR may be received. In this case, the bank address corresponding to the active command ACTa, the bank address corresponding to the precharge command PREb, and the bank address corresponding to the write command WR may be different from one another. For example, the active command ACTa may correspond to the first bank address BA1, the write command WR may correspond to the second bank address BA2, and the precharge command PREb may correspond to the third bank address BA3.

After the precharge command PREb is completely received, the memory device 200 may receive the active command ACTc at the fourth point in time t4 without delay. After the active command ACTc is completely received, the memory device 200 may receive the no operation row command RNOP at the fifth point in time t5 corresponding to the falling edge of the clock signal CK_c and may receive the precharge command PREd at the sixth point in time t6 corresponding to the rising edge of the clock signal CK_c. After the active command ACTc is completely received, the precharge command PREd may be received with delay of the 0.5 cycle. After the precharge command PREd is completely received, the memory device 200 may receive the no operation row command RNOP at the seventh point in time t7 corresponding to the falling edge of the clock signal CK_c. The memory device 200 may receive the read command RD from the sixth point in time t6 to the seventh point in time t7. Accordingly, during the 1 cycle of the clock signal CK_c corresponding to the sixth point in time t6 and the seventh point in time t7, the precharge command PREd, the no operation row command RNOP, and the read command RD may be received.

As described above, when the precharge command PRE is received at the rising and falling edge of the clock signal CK_c, the precharge command PRE may be received without or with delay after the active command ACT is completely received.

In FIGS. 3A to 3C, it is illustrated that the precharge command PRE for one memory bank is received. However, the inventive concept is not limited thereto. For example, the memory device 200 may receive the precharge command PRE corresponding to all memory banks at the rising and/or falling edge of the clock signal CK_c.

As described above, when the active command ACT is received during the 1.5 cycles of the clock signal CK_c and the precharge command PRE is received during the 0.5 cycle of the clock signal CK_c, the precharge command PRE may be received at the rising and/or falling edge of the clock signal CK_c. The memory device 200 may receive the precharge command PRE selectively transmitted by the memory controller 100 at a timing between the rising edge and the falling edge of the clock signal CK_c.

As described above, when the precharge command PRE is received at the falling edge of the clock signal CK_c, the precharge command PRE may be received during the 0.5 cycle without delay after the active command ACT is completely received during the 1.5 cycles and the active command ACT may be received without delay after the precharge command PRE is completely received. In addition, at a timing at which the active command ACT or the precharge command PRE is received, the write command WR or the read command RD may be received in parallel. Therefore, commands corresponding to a plurality of banks may be quickly received when memory access is continuously performed by an operation like in bank interleave or bank group interleave. Therefore, an operation speed of the memory device 200 may increase.

Figure 4A:
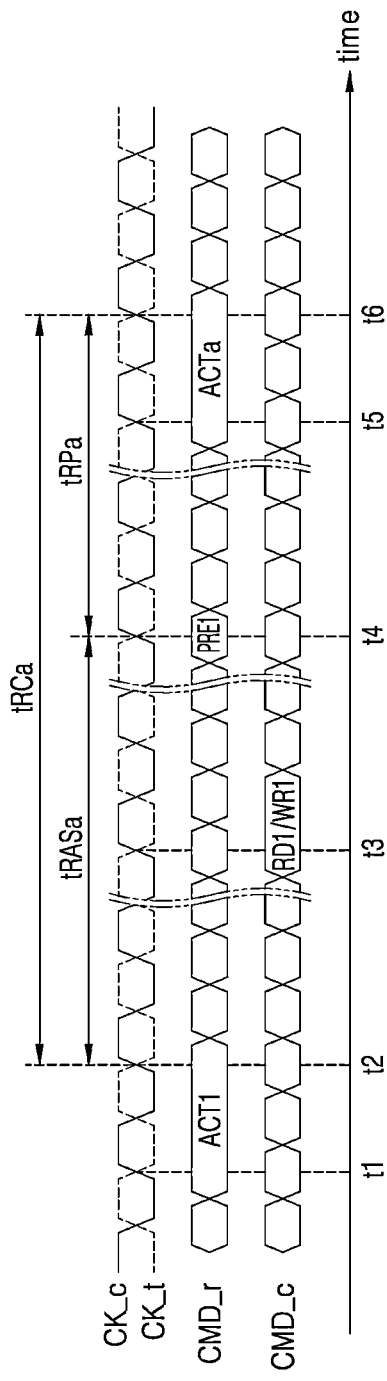
FIGS. 4A and 4B illustrate examples of a timing diagram in which the memory device of FIG. 1 receives commands for one memory bank according to example embodiments.
Figure 4B:
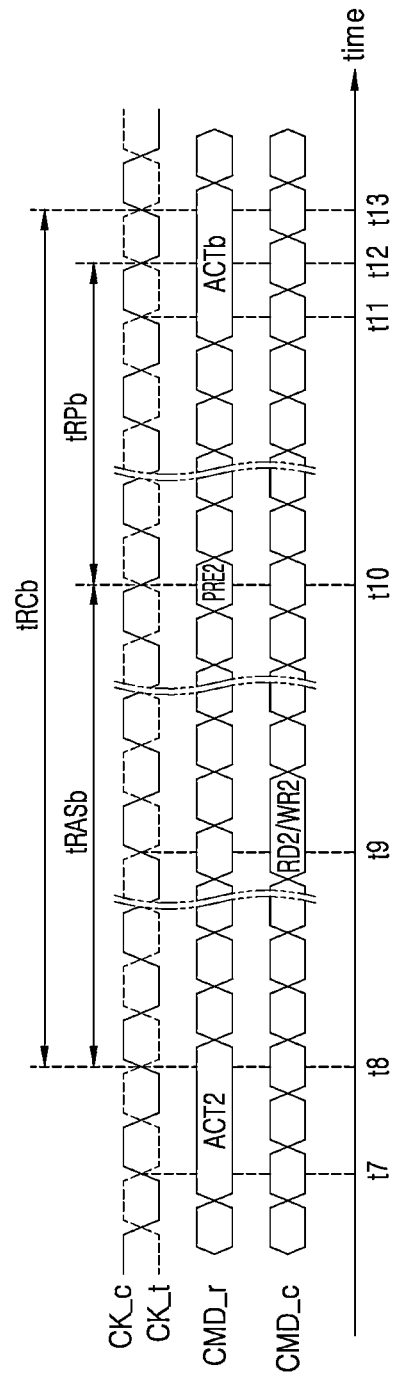

FIGS. 4A and 4B illustrate examples of a timing diagram in which the memory device 200 of FIG. 1 receives commands for one memory bank according to example embodiments. Specifically, FIG. 4A is a timing diagram illustrating that a precharge command PRE1 is received at the rising edge of the clock signal CK_c and FIG. 4B is a timing diagram illustrating that a precharge command PRE2 is received at the falling edge of the clock signal CK_c.

Referring to FIG. 4A, the memory device 200 may receive an active command ACT1 during the 1.5 cycles of the clock signal CK_c from the first point in time t1 to the second point in time t2. The memory device 200 may receive a read command RD1 or a write command WR1 in accordance with the active command ACT1 at the third point in time t3. After the read command RD1 or the write command WR1 is completely received, the memory device 200 may receive the precharge command PRE1 during the 0.5 cycle at the fourth point in time t4 corresponding to the rising edge of the clock signal CK_c. In this case, a minimum time interval tRASa between the active command ACT1 and the precharge command PRE1 (i.e., a minimum time interval for transmitting the precharge command PRE1 after the active command ACT1 is transmitted) may correspond to a time interval between the second point in time t2 corresponding to the rising edge of the clock signal CK_c and the fourth point in time t4 corresponding to the rising edge of the clock signal CK_c. For example, the minimum time interval tRASa may be determined by a standard.

After the precharge command PRE1 is completely received, the memory device 200 may receive the active command ACTa from the fifth point in time t5 to the sixth point in time t6. In this case, a minimum time interval tRPa between the precharge command PRE1 and the active command ACTa (i.e., a minimum time interval for transmitting the active command ACTa after the precharge command PRE1 is transmitted) may correspond to a time interval between the fourth point in time t4 corresponding to the rising edge of the clock signal CK_c and the sixth point in time t6 corresponding to the rising edge of the clock signal CK_c. For example, the minimum time interval tRPa may be determined by a standard.

As described above, when the two active commands ACT1 and ACTa are received for the same memory bank, a minimum time interval tRCa between the active command ACT1 and the active command ACTa (i.e., a minimum time interval for transmitting the active command ACTa after the active command ACT1 is transmitted) may correspond to a time interval between the second point in time t2 and the sixth point in time t6. For example, the minimum time interval tRCa may be determined by a standard.

Referring to FIG. 4B, the memory device 200 may receive an active command ACT2 during the 1.5 cycles of the clock signal CK_c from the seventh point in time t7 to an eighth point in time t8. The memory device 200 may receive a read command RD2 or a write command WR2 in accordance with the active command ACT2 at a ninth point in time t9. After the read command RD2 or the write command WR2 is completely received, the memory device 200 may receive a precharge command PRE2 for the 0.5 cycle at a tenth point in time t10 corresponding to the falling edge of the clock signal CK_c. In this case, a minimum time interval tRASb between the active command ACT2 and the precharge command PRE2 (i.e., a minimum time interval for transmitting the precharge command PRE2 after the active command ACT2 is transmitted) may correspond to a time interval between the eighth point in time t8 corresponding to the rising edge of the clock signal CK_c and the tenth point in time t10 corresponding to the falling edge of the clock signal CK_c. For example, the minimum time interval tRASb may be determined by a standard. In this case, the minimum time interval tRASa of FIG. 4A may be different from the minimum time interval tRASb of FIG. 4B. For example, the minimum time interval tRASa may be greater than the minimum time interval tRASb by the 0.5 cycle of the clock signal CK_c.

After the precharge command PRE2 is completely received, the memory device 200 may receive an active command ACTb from an 11$^{th}$ point in time t11 to a 13$^{th}$ point in time t13. In this case, a minimum time interval tRPb between the precharge command PRE2 and the active command ACTb (i.e., a minimum time interval for transmitting the active command ACTb after the precharge command PRE2 is transmitted) may correspond to a time interval between the tenth point in time t10 corresponding to the falling edge of the clock signal CK_c and the 12$^{th}$ point in time t12 corresponding to the falling edge of the clock signal CK_c. For example, the minimum time interval tRPb may be determined by a standard. In this case, the minimum time interval tRPa of FIG. 4A may be equal to the minimum time interval tRPb of FIG. 4B.

As described above, when the two active commands ACT2 and ACTb are received for the same memory bank, a minimum time interval tRCb between the active command ACT2 and the active command ACTb (i.e., a minimum time interval for transmitting the active command ACTb after the active command ACT2 is transmitted) may correspond to a time interval between the eighth point in time t8 and the 13$^{th}$ point in time t13. For example, the minimum time interval tRCb may be determined by a standard. In this case, the minimum time interval tRCa of FIG. 4A may be equal to the minimum time interval tRCb of FIG. 4B. However, the inventive concept is not limited thereto.

FIG. 5 is a flowchart illustrating an example operation of the memory device of FIG. 1. Specifically, FIG. 5 illustrates a memory access operation for one memory bank of the memory device 200 as described with reference to FIGS. 4A and 4B. Referring to FIGS. 1 and 5, in operation S201, the memory device 200 may receive the active command ACT through the row pin R_P. In this case, the memory device 200 may further receive the row address ADD_r including the specific memory bank address together with the active command ACT. The memory device 200 may activate the specific word line of the specific memory bank in response to the active command ACT.

In operation S202, the memory device 200 may receive the read command RD or the write command WR through the column pin C_P. In this case, the memory device 200 may further receive the column address ADD_c including the specific memory bank address together with the read command RD or the write command WR. The memory device 200 may read or write the data DATA from or in the memory cell of the specific memory bank in response to the read command RD or the write command WR.

In operation S203, the memory device 200 may receive the precharge command PRE at the rising or falling edge of the clock signal CK through the row pin R_P. The memory device 200 may further receive the row address ADD_r including the specific memory bank address together with the precharge command PRE. The memory device 200 may precharge the memory cells of the specific memory bank in response to the precharge command PRE. For example, as illustrated in FIGS. 3A to 4B, when the precharge command PRE is received during the 0.5 cycle of the clock signal CK, the memory device 200 may completely receive the precharge command PRE at the rising or falling edge of the clock signal CK. For another example, when the precharge command PRE is received during the cycle of the clock signal CK greater than the 0.5 cycle, the memory device 200 may start to receive the precharge command PRE at the rising or falling edge of the clock signal CK.

Figure 6:
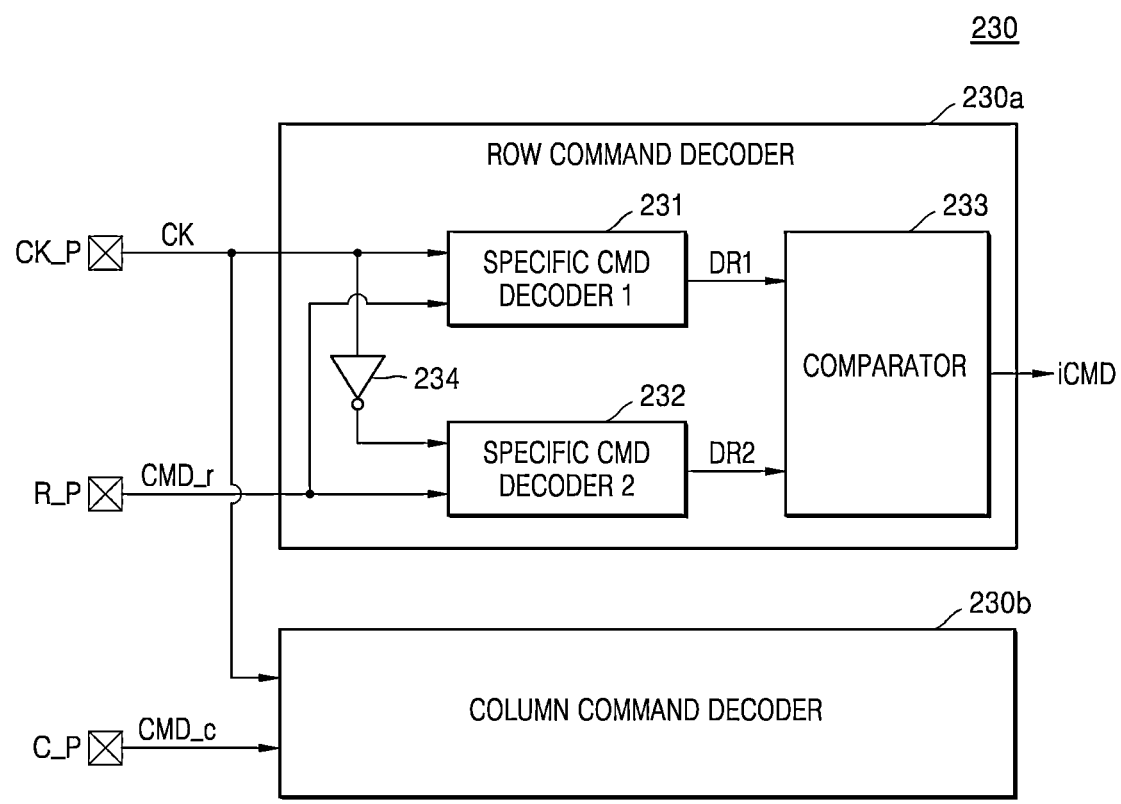
FIG. 6 is a block diagram of the control logic circuit of FIG. 2 according to an example embodiment.

FIG. 6 is a block diagram of the control logic circuit 230 of FIG. 2. Referring to FIG. 6, the control logic circuit 230 may include a row command decoder 230a and a column command decoder 230b. The row command decoder 230a may decode the row command CMD_r received through the row pin R_P based on the clock signal CK received through the clock pin CK_P. The column command decoder 230b may decode the column command CMD_c received through the column pin C_P based on the clock signal CK received through the clock pin CK_P.

The row command decoder 230a may decode the specific command (e.g., the precharge command PRE) received at the rising and/or falling edge of the clock signal CK in the row command CMD_r. The row command decoder 230a may include a first specific command decoder 231, a second specific command decoder 232, a comparator 233, and an inverter 234 in order to decode the specific command.

The first specific command decoder 231 may receive the clock signal CK and the row command CMD_r and may output a first decoding result DR1 representing whether the row command CMD_r is the specific command based on the rising edge of the clock signal CK.

The second specific command decoder 232 may receive a signal obtained by inverting the clock signal CK through the inverter 234 and the row command CMD_r. Therefore, the second specific command decoder 232 may output a second decoding result DR2 representing whether the row command CMD_r is the specific command based on the falling edge of the clock signal CK. In FIG. 6, the clock signal CK is illustrated as being input to the second specific command decoder 232 through the inverter 234. However, the inventive concept is not limited thereto. For example, as described with reference to FIGS. 3A to 3C, when the clock signal CK is formed of a differential pair, the clock signal CK_c may be input to the first specific command decoder 231 and a clock signal CK_t may be input to the second specific command decoder 232.

The comparator 233 may generate an internal command iCMD by comparing the first decoding result DR1 with the second decoding result DR2. For example, when the first decoding result DR1 or the second decoding result DR2 represents that the row command CMD_r is the specific command, the comparator 233 may generate the internal command iCMD corresponding to the specific command. Therefore, the memory device 200 may perform a corresponding operation in response to the internal command iCMD. For example, when the internal command iCMD represents the precharge command PRE, the memory device 200 may perform a precharge operation.

As described above, the control logic circuit 230 may sense the specific command received at the rising edge of the clock signal CK and the specific command received at the falling edge of the clock signal CK through a specific command decoder. In addition, as described with reference to FIGS. 3A to 3C, although the row command CMD_r and the column command CMD_c are received in parallel, the control logic circuit 230 may decode the row command CMD_r and the column command CMD_c in parallel through the row command decoder 230a and the column command decoder 230b.

Figure 7:
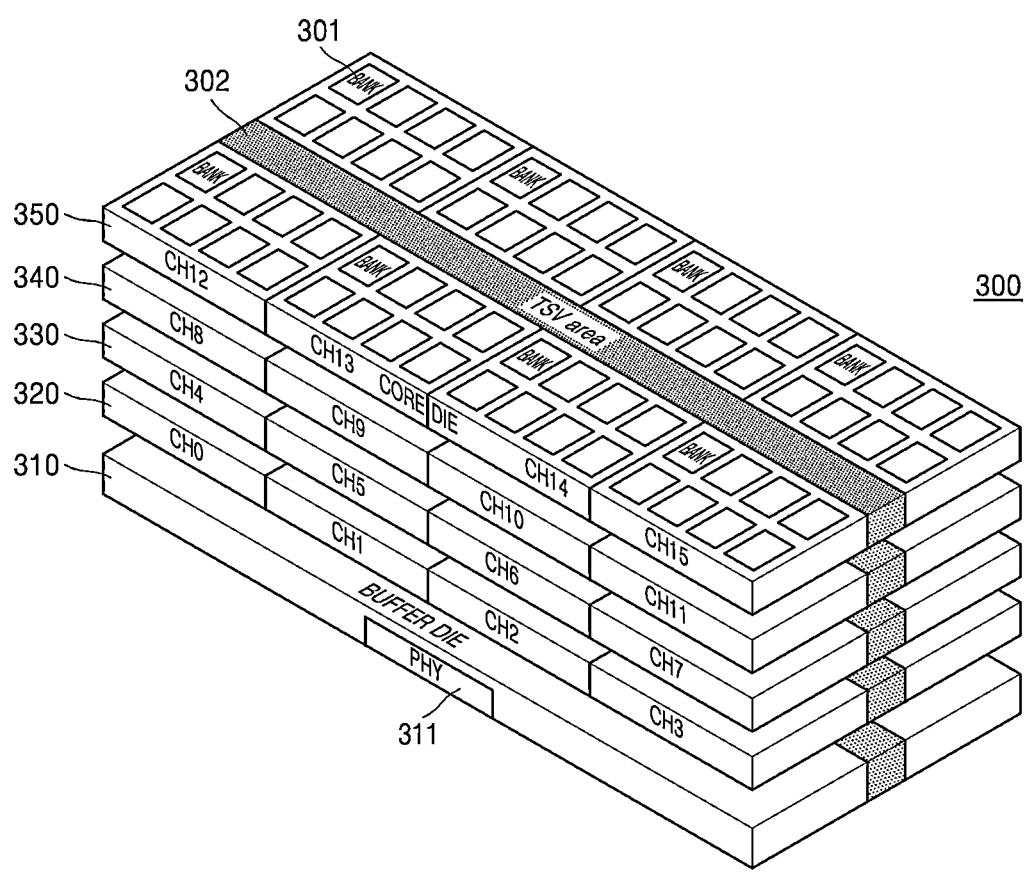
FIG. 7 is a block diagram illustrating a stacked memory device according to an example embodiment.

FIG. 7 is a block diagram illustrating a stacked memory device 300 according to example embodiments. Referring to FIG. 7, the stacked memory device 300 may correspond to the memory device 200 of FIG. 1. The stacked memory device 300 may include a buffer die 310 and first to fourth core dies 320 to 350. For example, the buffer die 310 may be referred to as an interface die, a base die, a logic die, or a master die and each of the first to fourth core dies 320 to 350 may be referred to as a memory die or a slave die. In FIG. 7, the stacked memory device 300 is illustrated as including four core dies, that is, the first to fourth core dies 320 to 350. However, the number of core dies may vary. For example, the stacked memory device 300 may include 8, 12, or 16 core dies.

The buffer die 310 and the first to fourth core dies 320 to 350 may be stacked through through silicon vias (TSV) and may be electrically connected to each other. Therefore, the stacked memory device 300 may have a three-dimensional memory structure in which the plurality of dies, that is, the first to fourth core dies 320 to 350, are stacked. For example, the stacked memory device 300 may be implemented based on the HBM standard or the HMC standard.

The stacked memory device 300 may support a plurality of functionally independent channels (or vaults). For example, as illustrated in FIG. 7, the stacked memory device 300 may support first to $16^{th}$ channels CH0 to CH15. When each of the first to $16^{th}$ channels CH0 to CH15 supports 64 data passages (that is, when 64 data pins are provided for each of the first to $16^{th}$ channels CH0 to CH15), the stacked memory device 300 including the first to $16^{th}$ channels CH0 to CH15 may support 1,024 data passages. However, the inventive concept is not limited thereto. The stacked memory device 300 may support no less than 1,024 data passages and various numbers of channels (e.g., eight channels). For example, when the stacked memory device 300 supports eight channels and each of the eight channels supports 128 data passages, the stacked memory device 300 may support 1,024 data passages.

Each of the first to fourth core dies 320 to 350 may support at least one channel. For example, as illustrated in FIG. 7, each of the first to fourth core dies 320 to 350 may support four channels CH0 to CH3, CH4 to CH7, CH8 to CH11, or CH12 to CH15. In this case, the first to fourth core dies 320 to 350 may support different channels. However, the inventive concept is not limited thereto. At least two of the first to fourth core dies may support the same channel. For example, when the stacked memory device 300 includes eight core dies, one of four core dies forming one stack and one of four core dies forming another stack may support the same channel. In this case, the core dies supporting the same channel may be distinguished by stack IDs SID.

Each of the channels may consists of an independent command and a data interface. For example, the channels may be independently clocked based on independent timing requirements and may not be synchronized with each other.

Each of the channels may include a plurality of memory banks 301. For example, the memory banks 301 included in one channel may correspond to the memory bank array 220 of FIG. 1. Each of the plurality of memory banks 301 may include memory cells connected to word lines and bit lines, a row decoder, a column decoder, and a sense amplifier. For example, each of the first to $16^{th}$ channels CH0 to CH15 may include 32 memory banks 301. However, the inventive concept is not limited thereto. Each of the first to $16^{th}$ channels CH0 to CH15 may include no less than eight memory banks 301. In FIG. 7, it is illustrated that the memory banks 301 included in one channel are included in one core die. However, the memory banks 301 included in one channel may be distributed among multiple core dies. For example, when the two of the first to fourth core dies support the first channel CH0, the memory banks 301 included in the first channel CH0 may be distributed between two core dies.

According to an example embodiment, the memory banks 301 included in one channel may be divided into a plurality of bank groups. For example, each of the plurality of bank groups may include four memory banks. However, the inventive concept is not limited thereto.

According to an example embodiment, one channel may be divided into two independently operating pseudo channels. For example, the pseudo channels may share a command and clock inputs (e.g., the clock signal CK and/or a clock enable signal CKE) of a channel, however, may independently decode and execute commands. For example, when one channel supports 64 data passages, each of the pseudo channels may support 32 data passages. For example, when one channel includes 32 memory banks 301, each of the pseudo channels may include 16 memory banks 301.

The buffer die 310 and the first to fourth core dies 320 to 350 may include a TSV area 302. TSVs formed to pass through the first to fourth core dies 320 to 350 may be arranged in the TSV area 302. The buffer die 310 may transmit and receive various signals to and from the first to fourth core dies 320 to 350 through the TSVs. The first to fourth core dies 320 to 350 may transmit and receive signals to and from the buffer die 310 and another core die through the TSVs. In this case, the signals may be independently transmitted and received through the corresponding TSVs by channel. For example, when an external host device (e.g., the memory controller 100 of FIG. 1) transmits a data signal to the first channel CH0 in order to store data in the memory cell of the first channel CH0, the buffer die 310 may store the data in the memory cell of the first channel CH0 by transmitting the data signal to the first core die 320 through the TSVs corresponding to the first channel CH0.

According to an example embodiment, in order to transmit the signals through the TSVs, a power supply voltage VDDQL may be used. The power supply voltage VDDQL may be less than a power supply voltage VDDQ used for an overall operation of the buffer die 310. For example, the power supply voltage VDDQ may be 1.1 V and the power supply voltage VDDQL may be 0.4 V.

The buffer die 310 may include a physical layer 311. The physical layer 311 may include interface circuits communicating with the external host device. According to an example embodiment, the physical layer 311 may include an interface circuit corresponding to each of the first to 16$^{th}$ channels CH0 to CH15. For example, an interface circuit corresponding to one channel may correspond to the memory interface circuit 210 of FIG. 1. The signals received from the external host device through the physical layer 311 may be transmitted to the first to fourth core dies 320 to 350 through the TSVs.

According to an example embodiment, the buffer die 310 may include a channel controller corresponding to each of the channels. The channel controller may manage memory reference operations of a corresponding channel and may determine a timing requirement of the corresponding channel.

According to an example embodiment, the buffer die 310 may include a plurality of pins for receiving the signals from the external host device. The buffer die 310 may receive the clock signal CK, a command/address signal C/A, a write data strobe signal WDQS, and a data signal DQ through the plurality of pins and may transmit a read data strobe signal RDQS and the data signal DQ. For example, the buffer die 310 may include two pins (e.g., the clock pin CK_P of FIG. 1) for receiving the clock signal CK, 18 pins (e.g., the row pin R_P and the column pin C_P of FIG. 1) for receiving the command/address signal C/A, four pins for receiving the write data strobe signal WDQS, four pins for transmitting the read data strobe signal RDQS, and 64 pins (e.g., the data pin D_P of FIG. 1) for transmitting and receiving the data signal DQ.

According to an example embodiment, the stacked memory device 300 may further include an error correction code (ECC) circuit for detecting and correcting an error of data. For example, in a write operation, the ECC circuit may generate parity bits for the data transmitted from the host device. In a read operation, the ECC circuit may detect and correct the error of the data transmitted from one of the first to fourth core dies 320 to 350 by using the parity bits and may transmit the error corrected data to the external host device.

According to an example embodiment, the stacked memory device 300 may receive the row command CMD_r through the row pin R_P and may receive the column command CMD_c through the column pin C_P as described with reference to FIGS. 1 to 6. The stacked memory device 300 may receive the specific command of the row command CMD_r at the rising and/or falling edge of the clock signal CK. The stacked memory device 300 may sense the specific command from the row command CMD_r transmitted at one of the rising and falling edges of the clock signal CK. For example, the specific command may be the precharge command PRE.

According to an example embodiment, the stacked memory device 300 may include the specific command decoder for sensing the specific command by decoding the row command CMD_r at the rising edge of the clock signal CK and sensing the specific command by decoding the row command CMD_r at the falling edge of the clock signal CK as illustrated in FIG. 6.

Figure 8:
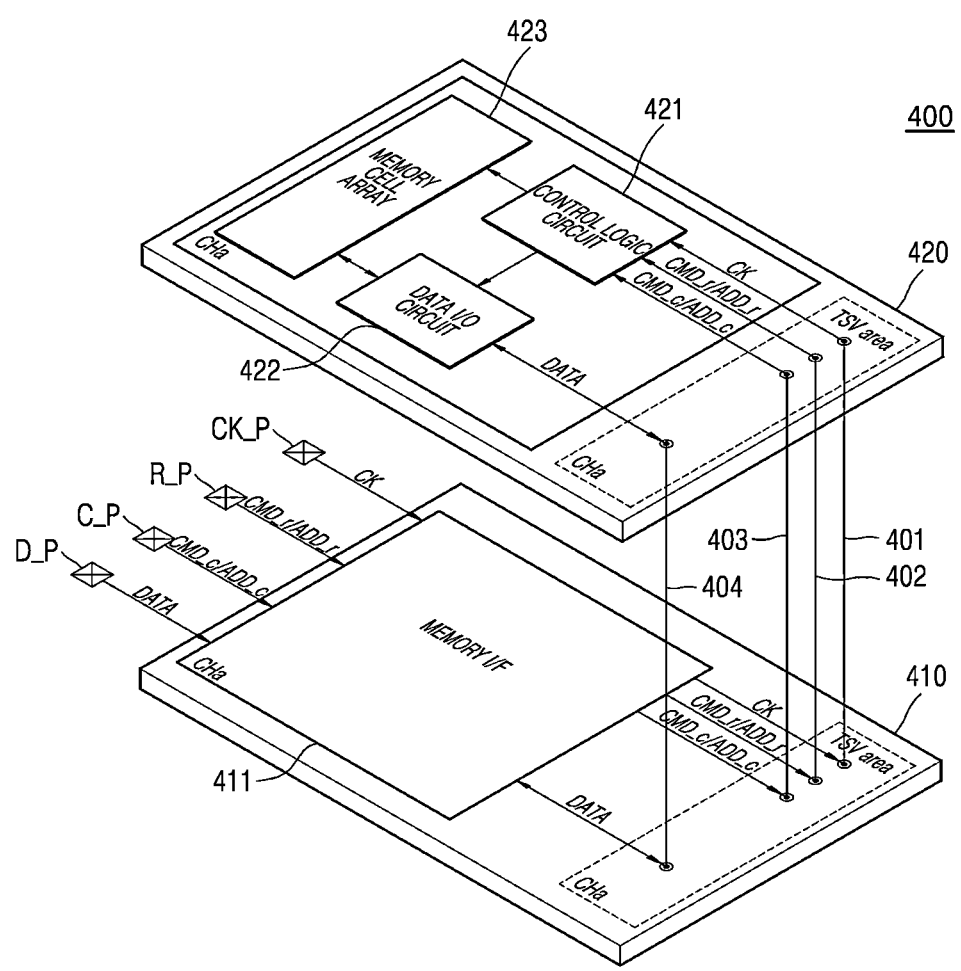
FIG. 8 is a block diagram of the stacked memory device of FIG. 7 according to an example embodiment.

FIG. 8 is an example block diagram of the stacked memory device 300 of FIG. 7. Referring to FIG. 8, the stacked memory device 400 may include a buffer die 410 and a core die 420. The core die 420 may support a channel CHa among a plurality of channels. The buffer die 410 and the core die 420 may communicate through TSVs 401 to 404 positioned in the TSV area. The TSVs 401 to 404 may be positioned in the TSV area corresponding to the channel CHa. For example, the buffer die 410 may transmit the clock signal CK to the core die 420 through the TSV 401, may transmit the row command/row address CMD_r/ADD_r to the core die 420 through the TSV 402, may transmit the column command/column address CMD_c/ADD_c to the core die 420 through the TSV 403, and may transmit and receive the data DATA to and from the core die 420 through the TSV 404. In FIG. 8, each of the TSVs 401 to 404 is implemented by one TSV. However, each of the TSVs 401 to 404 may be implemented by various numbers of TSVs.

The buffer die 410 may include a memory interface circuit 411 corresponding to the channel CHa. The memory interface circuit 411 may correspond to the memory interface circuit 210 of FIG. 1. The memory interface circuit 411 may receive the clock signal CK, the row command/row address CMD_r/ADD_r, the column command/column address CMD_c/ADD_c, and the data DATA that are transmitted to the channel CHa through the clock pin CK_P, the row pin R_P, the column pin C_P, and the data pin D_P corresponding to the channel CHa. The memory interface circuit 411 may transmit the clock signal CK, the row command/row address CMD_r/ADD_r, the column command/column address CMD_c/ADD_c, and the data DATA to the core die 420 through the TSVs 401 to 404. According to an example embodiment, the memory interface circuit 411 may transmit the signal processed clock signal CK, the row command/row address CMD_r/ADD_r, the column command/column address CMD_c/ADD_c, and the data DATA to the core die 420. The memory interface circuit 411 may transmit the data DATA transmitted from the core die 420 through the TSV 404 to the external host device (e.g., the memory controller 100 of FIG. 1).

The core die 420 may include a control logic circuit 421, a data input and output circuit 422, and a memory cell array 423. The control logic circuit 421, the data input and output circuit 422, and the memory cell array 423 may support the channel CHa. The memory cell array 423 may be included in one of the memory banks included in the channel CHa. The control logic circuit 421, the data input and output circuit 422, and the memory cell array 423 may respectively correspond to the control logic circuit 230, the input and output circuit 240, and the memory cell array 221 of FIG. 2. Therefore, previously given description may be omitted.

The control logic circuit 421 may receive the clock signal CK, the row command/row address CMD_r/ADD_r, and the column command/column address CMD_c/ADD_c that are transmitted from the buffer die 410 through the TSVs 401 to 403. The control logic circuit 421 may decode the row command/row address CMD_r/ADD_r and the column command/column address CMD_c/ADD_c. According to an example embodiment, the control logic circuit 421 may sense the specific command (e.g., the precharge command PRE) by decoding the row command CMD_r received at the rising edge of the clock signal CK and may sense the specific command by decoding the row command CMD_r received at the falling edge of the clock signal CK as described with reference to FIG. 6. The control logic circuit 421 may control the data input and output circuit 422 and the memory cell array 423 based on the decoding result.

The data input and output circuit 422 may transmit and receive the data DATA to and from the buffer die 410 through the TSV 404. In a write operation, the data input and output circuit 422 may transmit the data DATA transmitted from the buffer die 410 through the TSV 404 to the memory cell array 423. Therefore, the memory cell array 423 may store the data DATA. In a read operation, the data input and output circuit 422 may transmit the data DATA output from the memory cell array 423 to the buffer die 410 through the TSV 404.

In FIG. 8, it is illustrated that the row command CMD_r and the column command CMD_c are decoded by the core die 420 through the control logic circuit 421 of the core die 420. However, the inventive concept is not limited thereto. For example, the row command CMD_r and the column command CMD_c may be decoded through the command decoder included in the memory interface circuit 411 of the buffer die 410.

Figure 9:
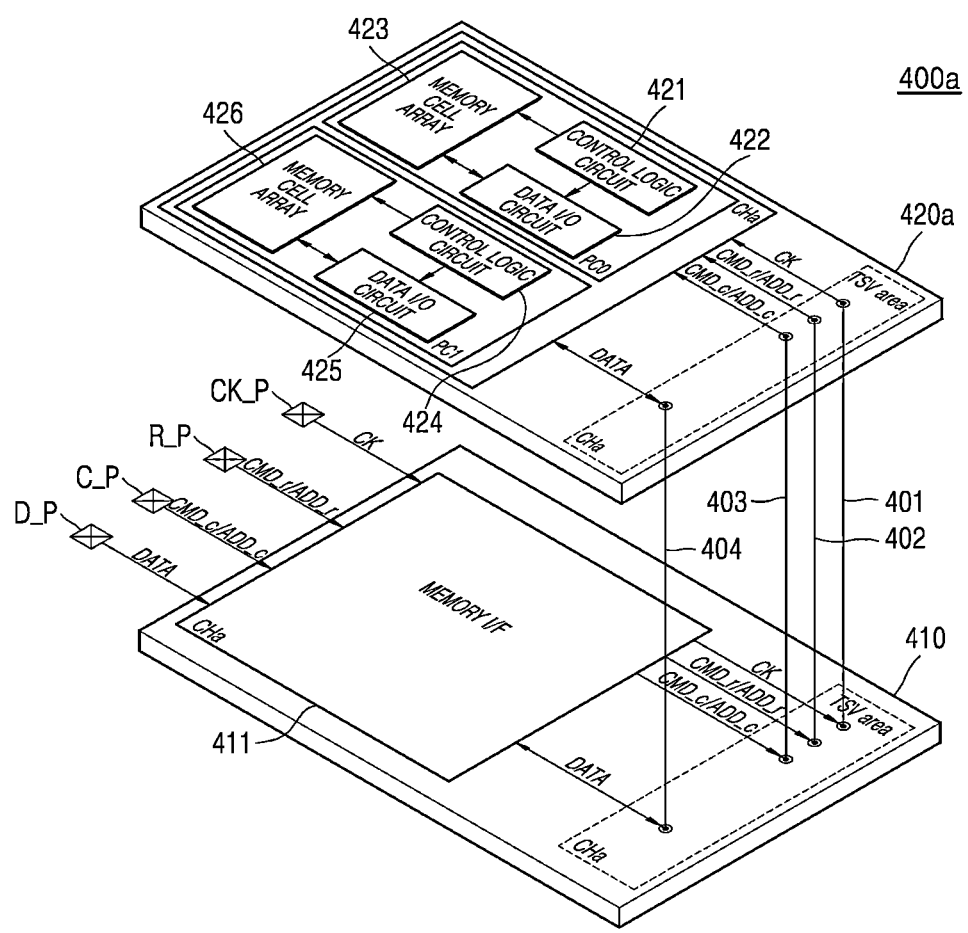
FIG. 9 is a block diagram illustrating an example of enlargement of the stacked memory device of FIG. 8 according to an example embodiment.

FIG. 9 is a block diagram illustrating an example of enlargement of the stacked memory device 400 of FIG. 8. Referring to FIG. 9, the stacked memory device 400a may include a buffer die 410 and a core die 420a. The core die 420a may support the channel CHa divided into a first pseudo channel PC0 and a second pseudo channel PC1. The core die 420a may include the control logic circuit 421, the data input and output circuit 422, and the memory cell array 423 supporting the first pseudo channel PC0 and a control logic circuit 424, a data input and output circuit 425, and a memory cell array 426 supporting the second pseudo channel PC1. Because the control logic circuit 424, the data input and output circuit 425, and the memory cell array 426 respectively correspond to the control logic circuit 421, the data input and output circuit 422, and the memory cell array 423, detailed description thereof will not be given.

The control logic circuit 421 may receive the clock signal CK, the row command/row address CMD_r/ADD_r, and the column command/column address CMD_c/ADD_c from the buffer die 410 through the TSVs 401 to 403. When the row address ADD_r represents the first pseudo channel PC0, the control logic circuit 421 may decode the row command CMD_r. When the column address ADD_c represents the first pseudo channel PC0, the control logic circuit 421 may decode the column command CMD_c. That is, the control logic circuit 421 may decode the row command CMD_r and the column command CMD_c corresponding to the first pseudo channel PC0 and may control the data input and output circuit 422 and the memory cell array 423 in accordance with the decoding result.

The control logic circuit 424 may receive the clock signal CK, the row command/row address CMD_r/ADD_r, and the column command/column address CMD_c/ADD_c transmitted from the buffer die 410 through the TSVs 401 to 403. When the row address ADD_r represents the second pseudo channel PC1, the control logic circuit 424 may decode the row command CMD_r. When the column address ADD_c represents the second pseudo channel PC1, the control logic circuit 424 may decode the column command CMD_c. That is, the control logic circuit 424 may decode the row command CMD_r and the column command CMD_c corresponding to the second pseudo channel PC1 and may control the data input and output circuit 425 and the memory cell array 426 in accordance with the decoding result.

Figure 10:
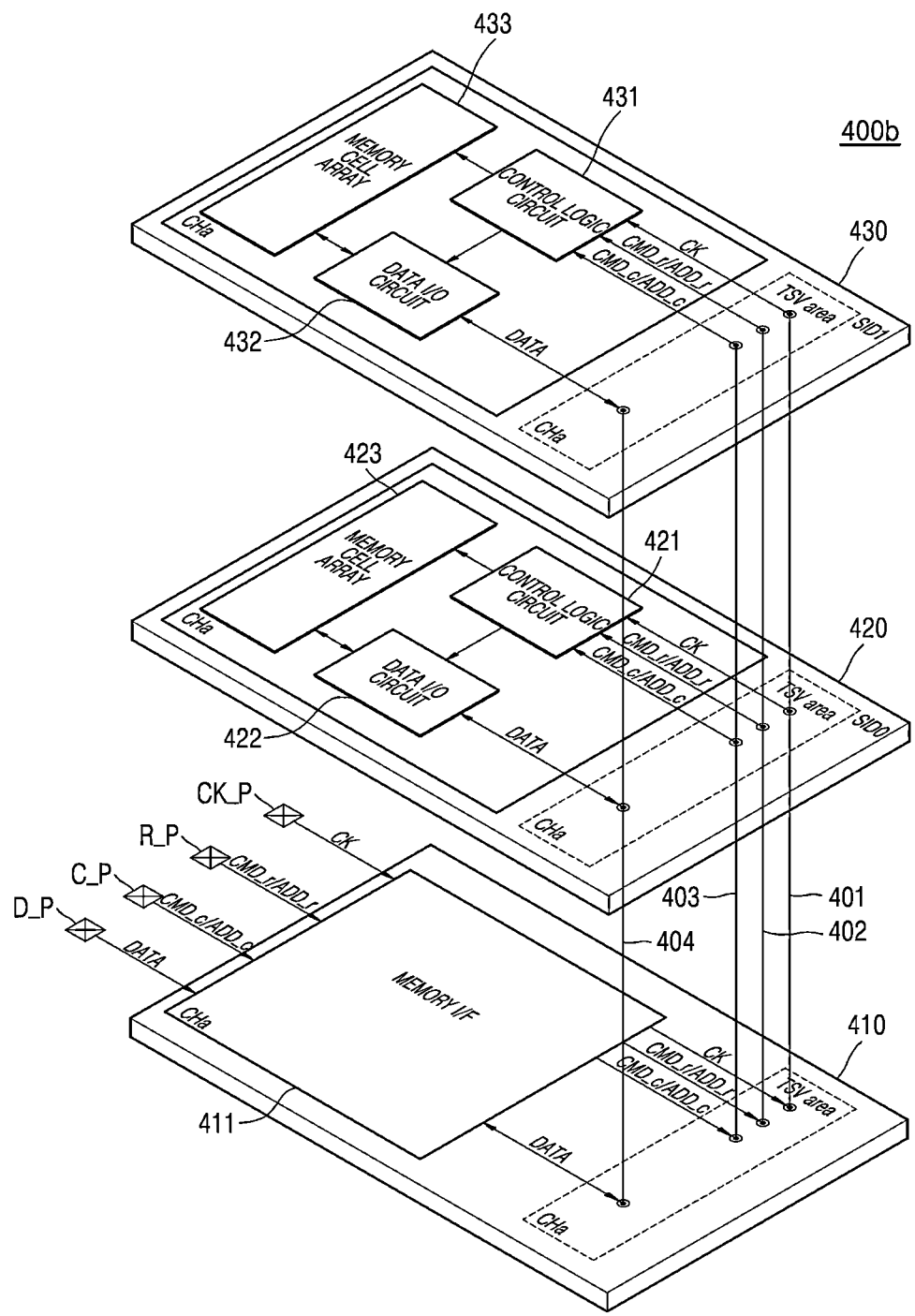
FIG. 10 is a block diagram illustrating an example of enlargement of the stacked memory device of FIG. 8 according to an example embodiment.

FIG. 10 is a block diagram illustrating an example of enlargement of the stacked memory device 400a of FIG. 8. Referring to FIG. 10, the stacked memory device 400b may include a buffer die 410, a first core die 420, and a second core die 430. The first core die 420 and the second core die 430 may support the same channel CHa among a plurality of channels. The first core die 420 may be included in one stack including a plurality of core dies, and the second core die 430 may be included in another stack including the plurality of core dies. In this case, the first and second core dies 420 and 430 may be distinguished by stack IDs SID. For example, the first core die 420 may correspond to a first stack ID SID0 and the second core die 430 may correspond to a second stack ID SID1. In FIG. 10, it is illustrated that another core die is not positioned between the first core die 420 and the second core die 430. However, another core die may be positioned between the first core die 420 and the second core die 430.

The buffer die 410 and the first and second core dies 420 and 430 may communicate through the TSVs 401 to 404 positioned in the TSV area. For example, the buffer die 410 may transmit the clock signal CK to the first and second core dies 420 and 430 through the TSV 401, may transmit the row command/row address CMD_r/ADD_r to the first and second core dies 420 and 430 through the TSV 402, may transmit the column command/column address CMD_c/ADD_c to the first and second core dies 420 and 430 through the TSV 403, and may transmit and receive the data DATA to and from the first and second core dies 420 and 430 through the TSV 404. In FIG. 10, it is illustrated that the buffer die 410 communicates with the first and second core dies 420 and 430 by using the TSVs 401 to 404. However, the buffer die 410 may communicate with the first and second core dies 420 and 430 by using separate TSVs corresponding to the first and second core dies 420 and 430.

The first core die 420 may include the control logic circuit 421, the data input and output circuit 422, and the memory cell array 423 supporting the channel CHa, and the second core die 430 may include a control logic circuit 431, a data input and output circuit 432, and a memory cell array 433 supporting the channel CHa. Because the control logic circuit 431, the data input and output circuit 432, and the memory cell array 433 respectively correspond to the control logic circuit 421, the data input and output circuit 422, and the memory cell array 423, detailed description thereof will be omitted.

The control logic circuit 421 may receive the clock signal CK, the row command/row address CMD_r/ADD_r, and the column command/column address CMD_c/ADD_c from the buffer die 410 through the TSVs 401 to 403. When the row address ADD_r represents the first stack ID SID0, the control logic circuit 421 may decode the row command CMD_r. When the column address ADD_c represents the first stack ID SID0, the control logic circuit 421 may decode the column command CMD_c. That is, the control logic circuit 421 may decode the row command CMD_r and the column command CMD_c corresponding to the first stack ID SID0 and may control the data input and output circuit 422 and the memory cell array 423 in accordance with the decoding result.

The control logic circuit 431 may receive the clock signal CK, the row command/row address CMD_r/ADD_r, and the column command/column address CMD_c/ADD_c from the buffer die 410 through the TSVs 401 to 403. When the row address ADD_r represents the second stack ID SID1, the control logic circuit 431 may decode the row command CMD_r. When the column address ADD_c represents the second stack ID SID1, the control logic circuit 431 may decode the column command CMD_c. That is, the control logic circuit 431 may decode the row command CMD_r and the column command CMD_c corresponding to the second stack ID SID1 and may control the data input and output circuit 432 and the memory cell array 433 in accordance with the decoding result.

Figure 11A:
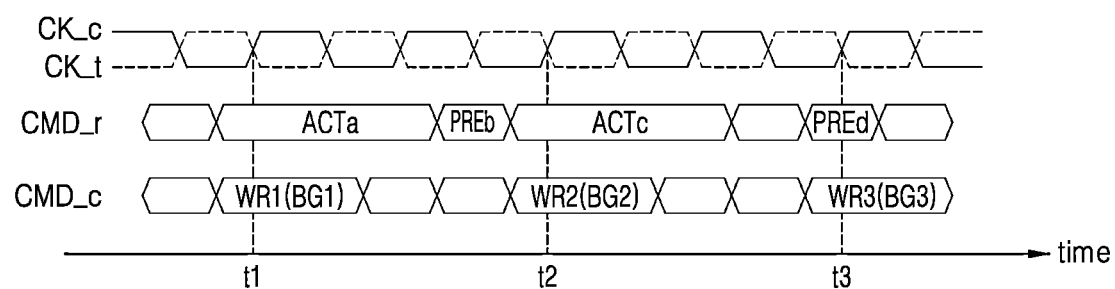
FIGS. 11A and 11B illustrate examples of a timing diagram in which the stacked memory device of FIG. 7 receives commands according to example embodiments.
Figure 11B:
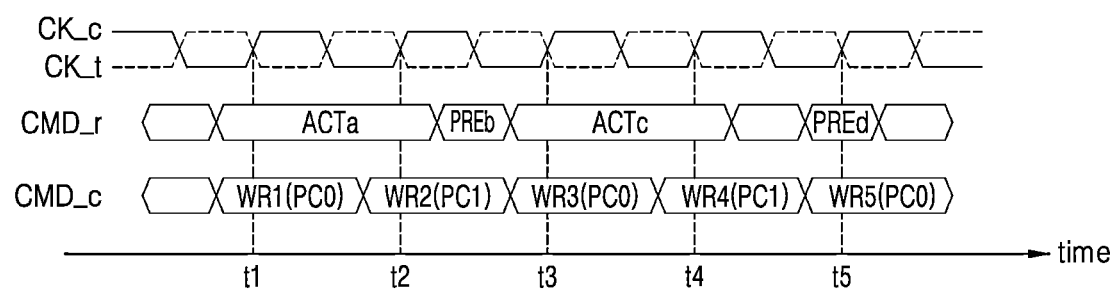

FIGS. 11A and 11B illustrate examples of a timing diagram in which the stacked memory device 300 of FIG. 7 receives commands according to example embodiments. Specifically, FIG. 11A illustrates an example in which a write command WR for first to third bank groups BG1 to BG3 is received. FIG. 11B illustrates an example in which a write command WR for different pseudo channels PC0 and PC1 is received.

Referring to FIGS. 11A and 11B, the stacked memory device 300 may receive the active command ACT for the 1.5 cycles, may receive the precharge command PRE for the 0.5 cycle, and may receive the write command WR for the 1 cycle. The stacked memory device 300 may receive the precharge command PRE at the rising and falling edge of the clock signal CK_c. For example, as illustrated in FIGS. 11A and 11B, after the active command ACTa is completely received, without delay, the stacked memory device 300 may receive the precharge command PREb at the falling edge of the clock signal CK_c. After the precharge command PREb is completely received, the stacked memory device 300 may receive the active command ACTc without delay. After the active command ACTc is completely received, the stacked memory device 300 may receive the precharge command PREd at the rising edge of the clock signal CK_c with delay of the 0.5 cycle. In this case, because examples of the row command CMD_c of FIGS. 11A and 11B correspond to the example of the row command CMD_c of FIG. 3C, detailed description thereof will be omitted. In FIGS. 11A and 11B, examples in which the write commands WR are received are described. However, the inventive concept is not limited thereto. For example, the write commands WR may be changed into read commands RD.

Referring to FIGS. 7 and 11A, the stacked memory device 300 may receive the active command ACTa and the first write command WR1 at the first point in time t1. In this case, the first write command WR1 may correspond to one of memory banks of the first bank group BG1. After the first write command WR1 is completely received, the stacked memory device 300 may receive the active command ACTc and the second write command WR2 at the second point in time t2. In this case, the second write command WR2 may correspond to one of memory banks of the second bank group BG2. After the second write command WR2 is completely received, the stacked memory device 300 may receive the precharge command PREd and the third write command WR3 at the third point in time t3. In this case, the third write command WR3 may correspond to one of memory banks of the third bank group BG3. For example, as illustrated in FIG. 11A, a time interval for receiving different write commands may be 2 tCK (i.e., the 2 cycles of the clock signal CK_c).

As described above, when the write commands WR or the read commands RD are continuously received for the different bank groups, after one write command WR or one read command RD is completely received, the stacked memory device 300 may receive another write command WR or another read command RD with delay.

Referring to FIGS. 7 and 11B, the stacked memory device 300 may sequentially receive the first to fifth write commands WR1 to WR5 from the first point in time t1 to the fifth point in time t5. A time interval for receiving the different write commands may be 1 tCK (i.e., the 1 cycle of the clock signal CK_c). For example, as illustrated in FIG. 11B, after one write command is completely received, another write command may be immediately received. In this case, the continuously received two write commands may correspond to different pseudo channels. For example, the first write command WR1, the third write command WR3, and the fifth write command WR5 may correspond to one of memory banks of the first pseudo channel PC0 and the second write command WR2 and the fourth write command WR4 may correspond to one of memory banks of the second pseudo channel PC1.

As described above, when the write commands WR or the read commands RD are continuously received for the different pseudo channels, after one write command WR or one read command RD is completely received, the stacked memory device 300 may receive another write command WR or another read command RD without delay. Therefore, the stacked memory device 300 may quickly receive commands when memory access is continuously performed by an operation like in pseudo channel interleave.

FIG. 12A is a table illustrating an example of a row command according to an example embodiment, and FIG. 12B is a table illustrating an example of a column command according to an example embodiment.

Referring to FIG. 12A, the row command may include a no operation row command RNOP, an active command ACT, a precharge command PREpb for a specific bank, a precharge command PREab for all banks, a refresh command REFpb for a specific bank, a refresh command REFab for all banks, a refresh management command RFMpb for a specific bank, a refresh management command RFMab for all banks, a power-down entry command PDE, a self refresh entry command SRE, a power-down exit command PDX, and a self refresh exit command SRX.

The no operation row command RNOP, the precharge commands PREpb and PREab, the refresh commands REFpb and REFab, the refresh management commands RFMpb and RFMab, the power-down exit command PDX, and the self refresh exit command SRX may be received for the 0.5 cycle of the clock signal CK. In this case, the no operation row command RNOP and the precharge commands PREpb and PREab may be received at the rising edge R or the falling edge F of the clock signal CK as described with reference to FIGS. 3A to 3C. The refresh management commands RFMpb and RFMab, the power-down exit command PDX, and the self refresh exit command SRX may be received at the rising edge R of the clock signal CK.

The active command ACT may be received for the 1.5 cycles of the clock signal CK. For example, the active command ACT may be received to correspond to two rising edges R and falling edges F of the clock signal CK. The power-down entry command PDE and the self refresh entry command SRE may be received for the 1 cycle of the clock signal CK. For example, the power-down entry command PDE and the self refresh entry command SRE may be received to correspond to one rising edge R and one falling edge F of the clock signal CK.

The respective commands may be distinguished based on signal values received through first to tenth row pins R_P0 to R_P9. For example, when signal values corresponding to high levels H are received through the first to fourth row pins R_P0 to R_P3 at the rising edge R or the falling edge F of the clock signal CK, the row command may be sensed as the no operation row command RNOP. In this case, through the fifth to tenth row pins R_P4 to R_P9, signal values corresponding to a valid value V (e.g., a high level H or a low level L) may be received.

For example, when a signal value corresponding to the low level L is received through a first row pin R_P0 and signal values corresponding to the high level H are received through second and third row pins R_P1 and R_P2 at a first rising edge R of the clock signal CK, the row command may be sensed as the active command ACT. In this case, a pseudo channel PC may be received through a fourth row pin R_P3, a stack ID SID may be received through fifth and sixth row pins R_P4 and R_P5, and a bank address BA may be received through seventh to tenth row pins R_P6 to R_P9. For example, when the stacked memory device 300 is implemented by one stack, valid values V may be received through the fifth and sixth row pins R_P4 and R_P5 instead of the stack ID SID. While the active command ACT is received after the first rising edge R of the clock signal CK (i.e., at a first falling edge F and a second rising edge R of the clock signal CK), the signal values corresponding to the high level H may be received through the first and second row pins R_P0 and R_P1 and a row address RA may be received through the third to tenth row pins R_P2 to R_P9.

For example, when a signal value corresponding to the high level H is received through the first row pin R_P0 and signal values corresponding to the low level L are received through the second and third row pins R_P1 and R_P2 at the rising edge R or the falling edge F of the clock signal CK, the row command may be sensed as the precharge command PREpb. In this case, the pseudo channel PC may be received through the fourth row pin R_P3, the stack ID SID may be received through fifth and sixth row pins R_P4 and R_P5, and the bank address BA may be received through the seventh to tenth row pins R_P6 to R_P9. For example, when the stacked memory device 300 is implemented by one stack, the valid values V may be received through the fifth and sixth row pins R_P4 and R_P5 instead of the stack ID SID.

For example, when the signal values corresponding to the high level H are received through the first and third row pins R_P0 and R_P2 and the signal value corresponding to the low level L is received through the second row pin R_P1 at the rising edge R or the falling edge F of the clock signal CK, the row command may be sensed as the precharge command PREab. In this case, the pseudo channel PC may be received through the fourth row pin R_P3 and the valid value V may be received through the fifth to tenth row pins R_P4 to R_P9.

Based on the signal values received through the first to tenth row pins R_P0 to R_P9, the row command may be sensed as one of the refresh commands REFpb and REFab, the refresh management commands RFMpb and RFMab, the power-down entry command PDE, the self refresh entry command SRE, the power-down exit command PDX, and the self refresh exit command SRX.

Referring to FIG. 12B, column commands may include a no operation column command CNOP, read commands RD and RDA, write commands WR and WRA, a mode register set command MRS, and a mode register read command MRR. Here, the read command RDA and the write command WRA instruct an auto precharge operation together with a read operation and a write operation. The respective commands may be received for the 1 cycle corresponding to the rising edge R and the falling edge F of the clock signal CK.

The respective commands may be distinguished based on signal values received through first to eighth column pins C_P0 to C_P7. For example, when the signal values corresponding to the high level H are received through the first and third column pins C_P0 and C_P2 and the signal values corresponding to the low level L are received through the second and fourth row pins C_P1 and C_P3 at the rising edge R of the clock signal CK, the column command may be sensed as the read command RD. For example, when the signal value corresponding to the high level H is received through the first column pin C_P0 and the signal values corresponding to the low level L are received through the second to fourth column pins C_P1 to C_P3 at the rising edge R of the clock signal CK, the column command may be sensed as the write command WR.

When the read command RD or the write command WR is sensed through the first to fourth column pins C_P0 to C_P3, the pseudo channel PC may be received through the fifth column pin C_P4, the stack ID SID may be received through the sixth and seventh column pins C_P5 and C_P6, and a part of the bank address BA may be received through the eighth column pin C_P7. For example, when the stacked memory device 300 is implemented by one stack, the valid values V may be received through the sixth and seventh column pins C_P5 and C_P6 instead of the stack ID SID. While the read command RD or the write command WR is received after the rising edge R of the clock signal CK (that is, at the falling edge F of the clock signal CK), the remaining of the bank address BA may be received through the first to third column pins C_P0 to C_P2 and a column address CA may be received through the fourth to eighth column pins C_P3 to C_P7.

Based on signal values received through the first to eighth column pins C_P0 to C_P7, the column command may be sensed as one of the no operation column command CNOP, the read command RDA, the write command WRA, the mode register set command MRS, and the mode register read command MRR. Here, a mode register address MA and set information OP may be received together as the mode register set command MRS is received and the mode register address MA may be received together as the mode register read command MRR is received.

Figure 13:
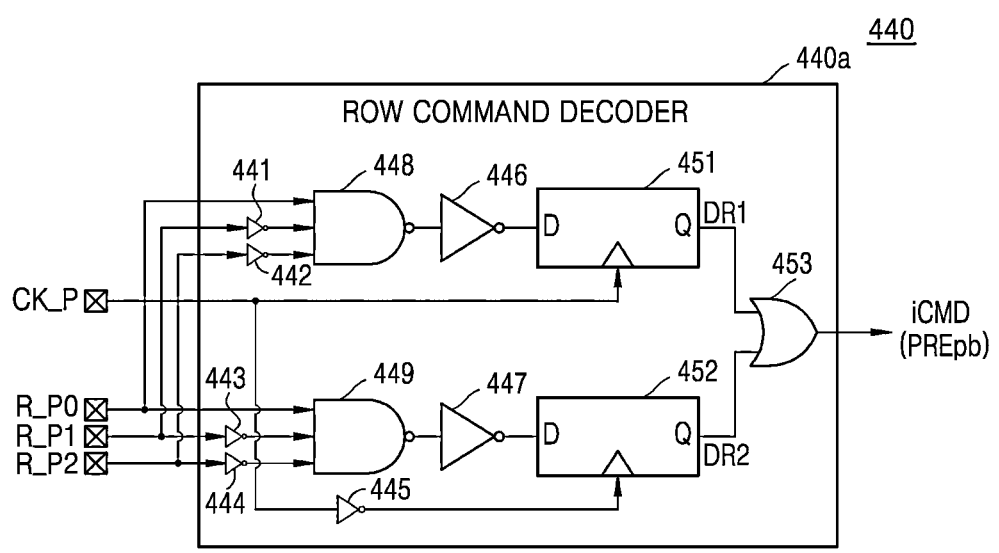
FIG. 13 is a circuit diagram of a control logic circuit for sensing a precharge command based on the row command of FIG. 12A according to an example embodiment.

FIG. 13 is an example circuit diagram of a control logic circuit 440 for sensing a precharge command according to the row command of FIG. 12A. Specifically, FIG. 13 is an example circuit diagram of a specific command decoder for sensing the precharge command PREpb for a specific bank. Referring to FIG. 13, the control logic circuit 440 may correspond to at least one of the control logic circuits 421, 424, and 431 of FIGS. 8 to 10. The control logic circuit 440 may include inverters 441 to 447, NAND gates 448 and 449, flipflops 451 and 452, and an OR gate 453. The inverters 441, 442, and 446, the NAND gate 448, and the flipflop 451 may correspond to the first specific command decoder 231 of FIG. 6, the inverters 443, 444, and 447, the NAND gate 449, and the flipflop 452 may correspond to the second specific command decoder 232 of FIG. 6, and the OR gate 453 may correspond to the comparator 233 of FIG. 6.

When the precharge command PREpb representing the row command is received, as described with reference to FIG. 12A, the signal values respectively corresponding to the high level H, the low level L, and the low level L may be received through the first to third row pins R_P0 to R_P2. The signal value received through the first row pin R_P0 may be input to each of the NAND gates 448 and 449 and the signal values received through the second and third row pins R_P1 and R_P2 may be inverted by the inverters 441 to 444 and may be respectively input to the NAND gates 448 and 449. Therefore, the signal values corresponding to the high level H may be input to each of the NAND gates 448 and 449 and the signal value corresponding to the low level L may be output from each of the NAND gates 448 and 449. The signal values output from the NAND gates 448 and 449 may be inverted by the inverters 446 and 447 and may be input to input terminals D of the flipflops 451 and 452.

The flipflop 451 may output the signal value input to the input terminal D based on the rising edge R of the clock signal CK received through the clock pin CK_P to an output terminal Q as a first decoding result DR1. For example, when the row command representing the precharge command PREpb is received at the rising edge R of the clock signal CK, the flipflop 451 may output the first decoding result DR1 corresponding to the high level H. For example, when the row command representing the precharge command PREpb is not received at the rising edge R of the clock signal CK, the flipflop 451 may output the first decoding result DR1 corresponding to a low level L.

The flipflop 452 may receive a signal obtained by inverting the clock signal CK by the inverter 445. That is, the flipflop 452 may output the signal value input to the input terminal D based on the falling edge F of the clock signal CK to the output terminal Q as the second decoding result DR2. For example, when the row command representing the precharge command PREpb is received at the falling edge F of the clock signal CK, the flipflop 452 may output the second decoding result DR2 corresponding to a high level H. For example, when the row command representing the precharge command PREpb is not received at the falling edge F of the clock signal CK, the flipflop 452 may output the second decoding result DR2 corresponding to a low level L.

The OR gate 453 may output an internal command iCMD representing the precharge command PREpb by comparing the first decoding result DR1 or the second decoding result DR2. For example, when the first decoding result DR1 or the second decoding result DR2 is at a high level H (that is, when the row command represents the precharge command PREpb), the OR gate 453 may output the internal command iCMD at a high level H, which indicates that the precharge command PREpb is sensed.

The control logic circuit 440 illustrated in FIG. 13 is only an example. The inventive concept is not limited thereto. For example, the control logic circuit 440 may include a plurality of logic gates capable of performing a first logical operation (e.g., a logical AND operation) instead of the NAND gate 448 or 449 or a plurality of logic gates capable of performing a second logical operation (e.g., a logical OR operation) instead of the OR gate 453.

Figure 14:
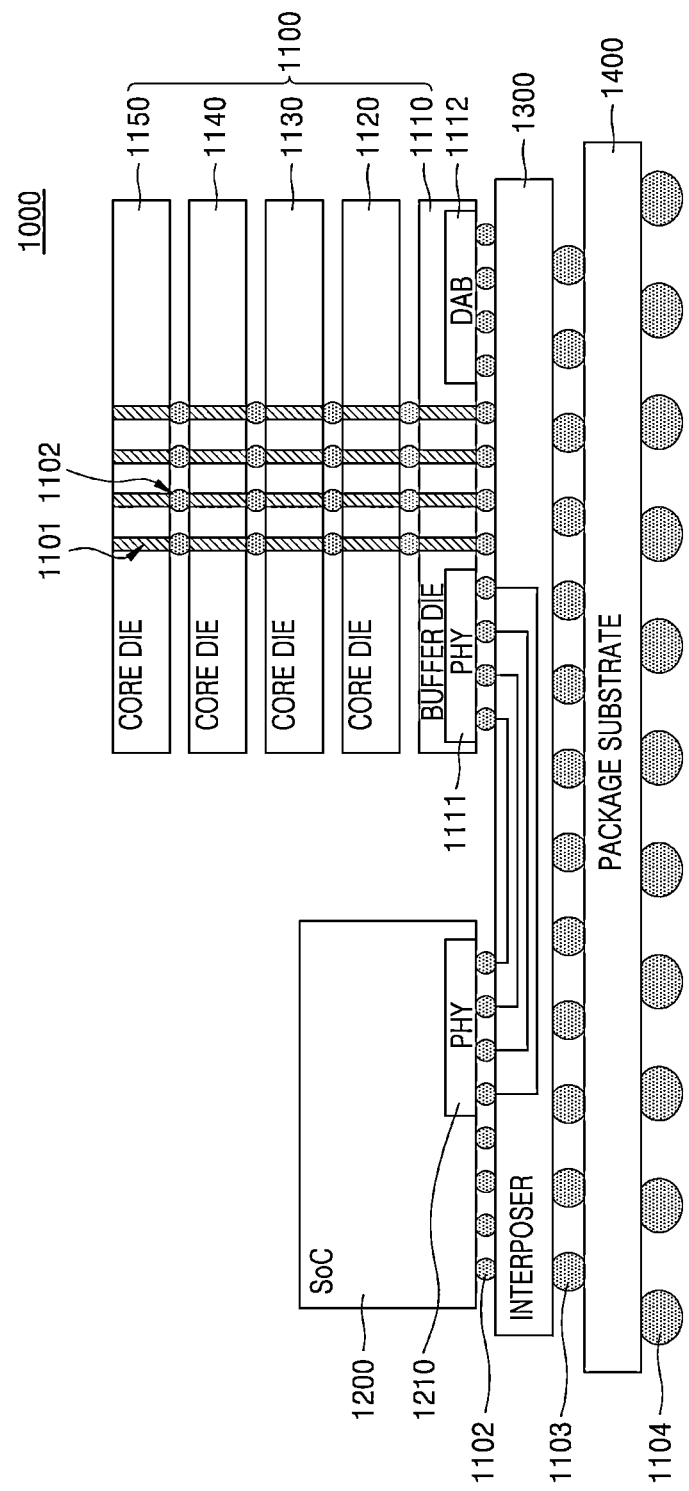
FIG. 14 is a view illustrating a semiconductor package according to an example embodiment.

FIG. 14 is a view illustrating a semiconductor package 1000 according to an example embodiment of the inventive concept. Referring to FIG. 14, the semiconductor package 1000 may include a stacked memory device 1100, a system on chip (SoC) 1200, an interposer 1300, and a package substrate 1400. The stacked memory device 1100 may include a buffer die 1110 and core dies 1120 to 1150. The stacked memory device 1100 may correspond to stacked memory devices 300, 400, 400a, and 400b described with reference to FIGS. 7 to 13.

Each of the core dies 1120 to 1150 may include memory cells for storing data. The buffer die 1110 may include a physical layer 1111 and direct access areas DAB and 1112. The physical layer 1111 may be electrically connected to a physical layer 1210 of the SoC 1200 through the interposer 1300. The stacked memory device 1100 may receive or transmit signals from or to the SoC 1200 through the physical layer 1111. The physical layer 1111 may include the memory interface circuit 411 of the buffer die 410 described with reference to FIGS. 8 to 10.

The direct access area 1112 may provide an access route capable of testing the stacked memory device 1100 without through the SoC 1200. The direct access area 1112 may include a conductive unit (e.g., a port or a pin) capable of directly communicating with an external test device. A test signal received through the direct access area 1112 may be transmitted to the core dies 1120 to 1150 through TSVs 1101. The data read from the core dies 1120 to 1150 for testing the core dies 1120 to 1150 may be transmitted to the external test device through the TSVs 1101 and the direct access area 1112. Therefore, a direct access test for the core dies 1120 to 1150 may be performed.

The buffer die 1110 and the core dies 1120 to 1150 may be electrically connected to each other through the TSVs 1101 and bumps 1102. The buffer die 1110 may receive the signals respectively provided from the SoC 1200 to channels through the bumps 1102 assigned to the channels or may transmit the signals to the SoC 1200 through the bumps 1102. For example, the bumps 1102 may be microbumps.

The SoC 1200 may execute applications supported by the semiconductor package 1000 by using the stacked memory device 1100. For example, the SoC 1200 may execute specialized operations including at least one processor among a central processing unit (CPU), an application processor (AP), a graphics processing unit (GPU), a neural processing unit (NPU), a tensor processing unit (TPU), a vision processing unit (VPU), an image signal processor (ISP), and a digital signal processor (DSP).

The SoC 1200 may control an overall operation of the stacked memory device 1100. The SoC 1200 may correspond to the memory controller 100 of FIG. 1. The SoC 1200 may include a physical layer 1210. The physical layer 1210 may include an interface circuit for transmitting and receiving the signals to and from the physical layer 1111 of the stacked memory device 1100. For example, the physical layer 1210 may include the host interface circuit 110 of FIG. 1. The SoC 1200 may provide various signals to the physical layer 1111 through the physical layer 1210. The signals provided to the physical layer 1111 may also be transmitted to the core dies 1120 to 1150 through an interface circuit of the physical layer 1111 and the TSVs 1101.

The interposer 1300 may connect the stacked memory device 1100 to the SoC 1200. The interposer 1300 may connect the physical layer 1111 of the stacked memory device 1100 to the physical layer 1210 of the SoC 1200 and may provide physical routes formed by using conductive materials. Therefore, the stacked memory device 1100 and the SoC 1200 may be stacked on the interposer 1300 and may transmit and receive the signals to and from each other.

Bumps 1103 may be attached onto the package substrate 1400, and solder balls 1104 may be attached under the package substrate 1400. For example, the bumps 1103 may be flipchip bumps. The interposer 1300 may be stacked on the package substrate 1400 through the bumps 1103. The semiconductor package 1000 may transmit and receive the signals to and from another external package or semiconductor devices through the solder balls 1104. For example, the package substrate 1400 may be a printed circuit board (PCB).

According to an example embodiment, the physical layer 1111 of the buffer die 1110 may receive the row commands and the column commands from the SoC 1200 through the bumps 1102 as described with reference to FIGS. 1 to 13. The physical layer 1111 may receive a specific command (e.g., the precharge command PRE) among the row commands at the rising edge R or the falling edge F of the clock signal CK.

Figure 15:
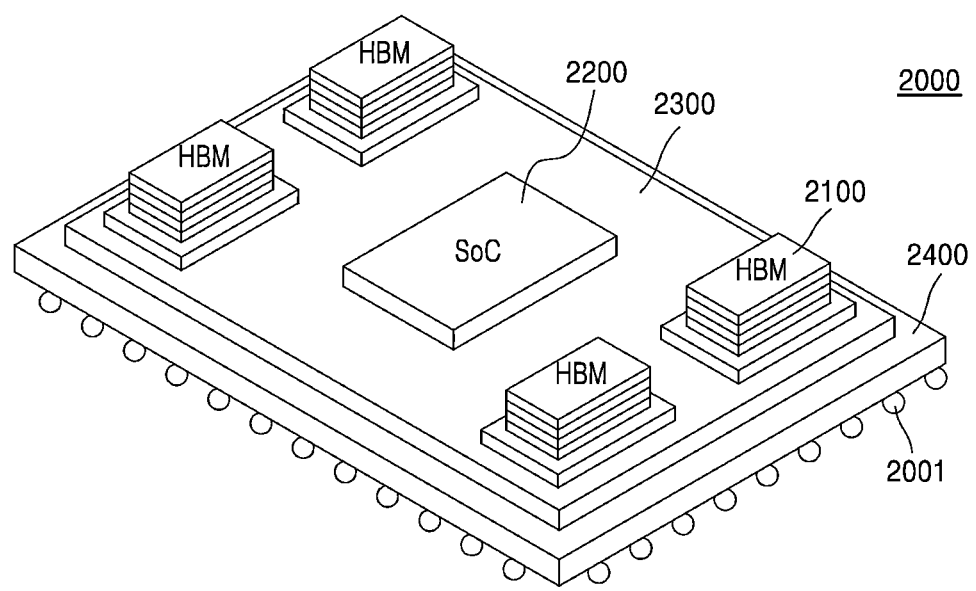
FIG. 15 is a view illustrating an implementation example of a semiconductor package according to an example embodiment.

FIG. 15 is a view illustrating an implementation example of a semiconductor package 2000 according to an example embodiment. Referring to FIG. 15, the semiconductor package 2000 may include a plurality of stacked memory devices 2100 and an SoC 2200. Each of the plurality of stacked memory devices 2100 may correspond to the stacked memory device 1100 of FIG. 14 and the SoC 2200 may correspond to the SoC 1200 of FIG. 14. The plurality of stacked memory devices 2100 and the SoC 2200 may be stacked on an interposer 2300, and the interposer 2300 may be stacked on a package substrate 2400. The semiconductor package 2000 may transmit and receive signals to and from another external package or semiconductor devices through solder balls 2001 attached under the package substrate 2400.

Each of the plurality of stacked memory devices 2100 may be implemented based on the HBM standard. However, the inventive concept is not limited thereto. Each of the plurality of stacked memory devices 2100 may be implemented based on the GDDR standard, the HMC standard, or the wide I/O standard.

The SoC 2200 may include at least one processor such as a CPU, an AP, a GPU, or an NPU and a plurality of memory controllers for controlling the plurality of stacked memory devices 2100. The SoC 2200 may transmit and receive the signals to and from a corresponding stacked memory device through a memory controller.

Figure 16:
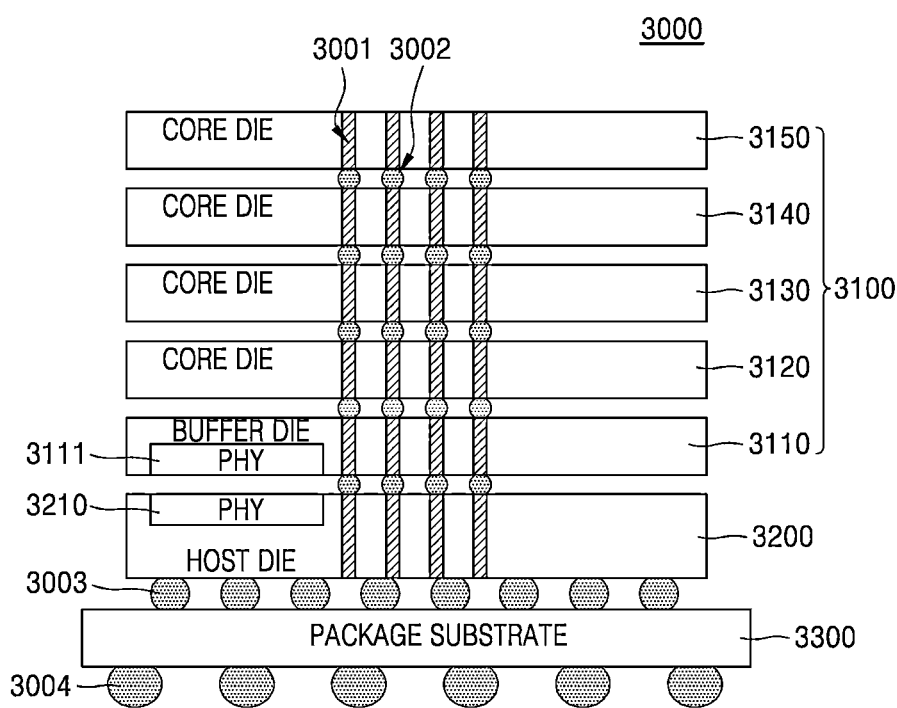
FIG. 16 is a view illustrating a semiconductor package according to another example embodiment.

FIG. 16 is a view illustrating a semiconductor package 3000 according to another example embodiment. Referring to FIG. 16, the semiconductor package 3000 may include a stacked memory device 3100, a host die 3200, and a package substrate 3300. The stacked memory device 3100 may include a buffer die 3110 and core dies 3120 to 3150. The buffer die 3110 may include a physical layer 3111 for communicating with the host die 3200, and each of the core dies 3120 to 3150 may include memory cells for storing data. The stacked memory device 3100 may correspond to the stacked memory devices 300, 400, 400a, and 400b described with reference to FIGS. 7 to 13.

The host die 3200 may include a physical layer 3210 for communicating with the stacked memory device 3100. The physical layer 3111 and the physical layer 3210 may communicate with each other through TSVs 3001. The host die 3200 may correspond to the memory controller 100 of FIG. 1, and the physical layer 3111 may correspond to the host interface circuit 110 of FIG. 1. The host die 3200 may include a processor for controlling an overall operation of the semiconductor package 3000 and executing an application supported by the semiconductor package 3000. For example, the host die 3200 may include at least one processor such as a CPU, an AP, a GPU, or an NPU.

The stacked memory device 3100 may be arranged on the host die 3200 based on the TSVs 3001 and may be vertically stacked on the host die 3200. Therefore, the buffer die 3110, the core dies 3120 to 3150, and the host die 3200 may be electrically connected to each other through the TSVs 3001 and bumps 3002 without an interposer. For example, the bumps 3002 may be microbumps.

Bumps 3003 may be attached onto the package substrate 3300 and solder balls 3004 may be attached under the package substrate 3300. For example, the bumps 3003 may be flipchip bumps. The host die 3200 may be stacked on the package substrate 3300 through the bumps 3003. The semiconductor package 3000 may transmit and receive signals to and from another external package or semiconductor devices through the solder balls 3004.

According to an example embodiment, the physical layer 3111 of the buffer die 3110 may receive the row commands and the column commands from the host die 3200 through the TSVs 3001 as described with reference to FIGS. 1 to 13. The physical layer 3111 may receive a specific command (e.g., the precharge command PRE) among the row commands at the rising edge R or the falling edge F of the clock signal CK.

According to another embodiment, the stacked memory device 3100 may be implemented only by the core dies 3120 to 3150 without the buffer die 3110. In this case, each of the core dies 3120 to 3150 may further include interface circuits for communicating with the host die 3200. In this case, each of the core dies 3120 to 3150 may transmit and receive signals to and from the physical layer 3210 of the host die 3200 through the TSVs 3001.

Figure 17:
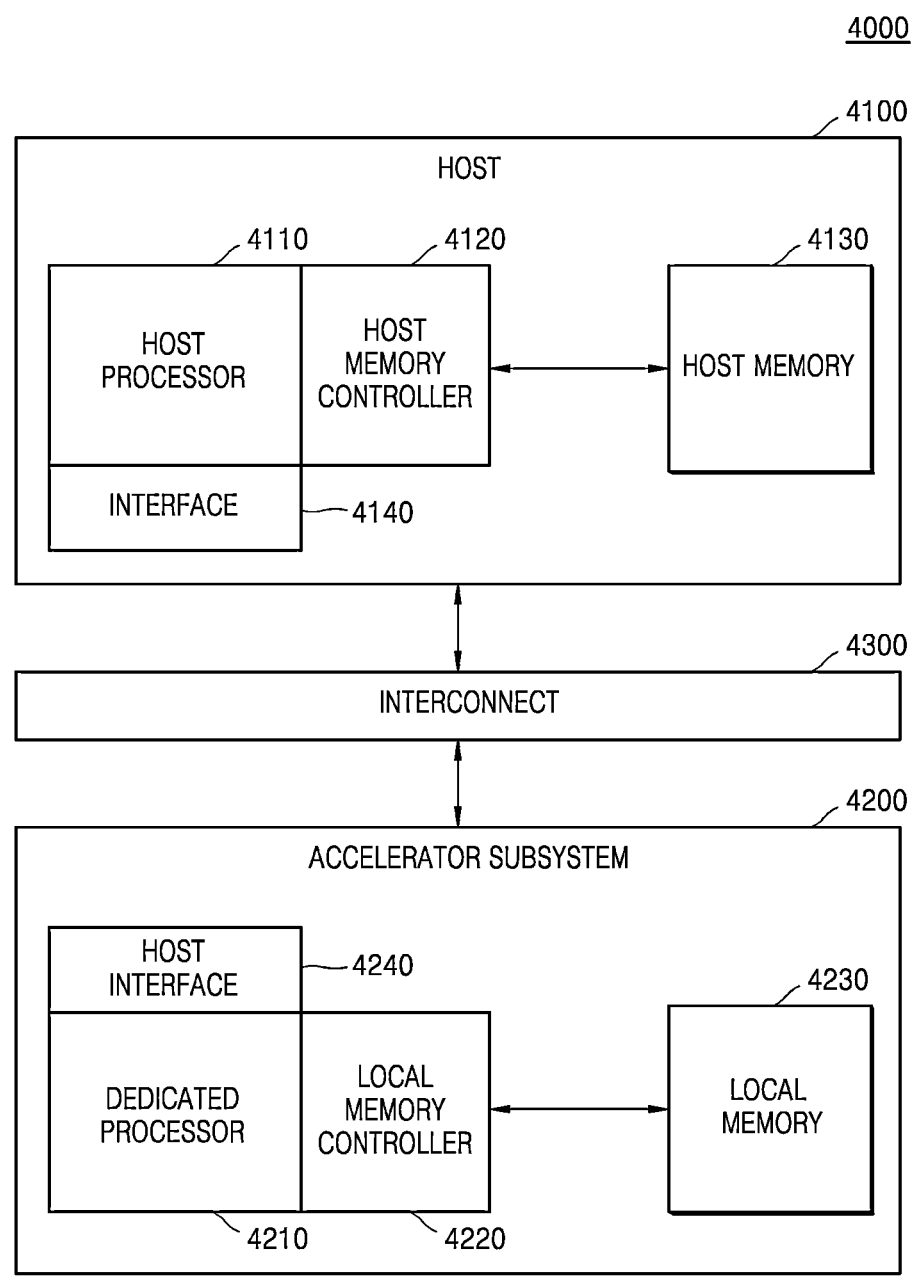
FIG. 17 is a block diagram illustrating a computing system according to an example embodiment.

FIG. 17 is a block diagram illustrating a computing system 4000 according to an example embodiment. The computing system 4000 may be implemented by one electronic device or may be dispersed into two or more electronic devices. For example, the computing system 4000 may be implemented by at least one of various electronic devices such as a desktop computer, a laptop computer, a tablet computer, a smart phone, a self-driving car, a digital camera, a wearable device, a healthcare device, a server system, a data center, a drone, a handheld game console, an Internet of Things (IoT) device, a graphics accelerator, and an artificial intelligence (AI) accelerator.

Referring to FIG. 17, the computing system 4000 may include a host 4100, an accelerator subsystem 4200, and an interconnect 4300. The host 4100 may control an overall operation of the accelerator subsystem 4200 and the accelerator subsystem 4200 may operate in accordance with control of the host 4100. The host 4100 and the accelerator subsystem 4200 may be connected through the interconnect 4300. Various signals and data may be transmitted and received between the host 4100 and the accelerator subsystem 4200 through the interconnect 4300.

The host 4100 may include a host processor 4110, a host memory controller 4120, host memory 4130, and an interface circuit 4140. The host processor 4110 may control an overall operation of the computing system 4000. The host processor 4110 may control the host memory 4130 through the host memory controller 4120. The host processor 4110 may control the accelerator subsystem 4200 connected through the interconnect 4300. For example, the host processor 4110 may assign a work to the accelerator subsystem 4200 by transmitting a command to the accelerator subsystem 4200.

The host processor 4110 may be a general purpose processor or a main processor performing general operations related to various operations of the computing system 4000. For example, the host processor 4110 may be a CPU or an AP.

The host memory 4130 may be main memory of the computing system 4000. The host memory 4130 may store data processed by the host processor 4110 or data received from the accelerator subsystem 4200. For example, the host memory 4130 may be implemented by DRAM. However, the inventive concept is not limited thereto. The host memory 4130 may include at least one of volatile memory such as SRAM and non-volatile memory such as flash memory, PRAM, RRAM, or MRAM.

The interface circuit 4140 may be formed so that the host 4100 communicates with the accelerator subsystem 4200. The host processor 4110 may transmit and receive control signals and data to and from the accelerator subsystem 4200 through the interface circuit 4140. According to an example embodiment, the host processor 4110, the host memory controller 4120, and the interface circuit 4140 may be implemented by one chip.

The accelerator subsystem 4200 may perform a specific function in accordance with control of the host 4100. For example, the accelerator subsystem 4200 may perform operations specialized to a specific application in accordance with the control of the host 4100. The accelerator subsystem 4200 may be physically or electrically connected to the hosts 4100 or may be implemented in various forms such as a module, a card, a package, a chip, and a device to be wired or wirelessly connected. For example, the accelerator subsystem 4200 may be implemented by a graphics card or an accelerator card. For example, the accelerator subsystem 4200 may be implemented based on a field programmable gate array (FPGA) or an application specific integrated circuit (ASIC).

According to an example embodiment, the accelerator subsystem 4200 may be implemented based on at least one of various packaging techniques. For example, the accelerator subsystem 4200 may be implemented by a packaging technique such as ball grid arrays (BGAs), a multichip package (MCP), a system on package (SOP), a system in package (SIP), a package on package (POP), chip scale packages (CSPs), a wafer level package (WLP), or a panel level package (PLP). For example, partial or all components of the accelerator subsystem 4200 may be connected through copper-to-copper boding. For example, partial or all components of the accelerator subsystem 4200 may be connected through an interposer such as a silicon interposer, an organic interposer, a glass interposer, or an active interposer. For example, partial or all components of the accelerator subsystem 4200 may be stacked based on a through silicon via (TSV). For example, partial or all components of the accelerator subsystem 4200 may be connected through a high speed linkage (e.g., a silicon bridge).

The accelerator subsystem 4200 may include a dedicated processor 4210, a local memory controller 4220, local memory 4230, and a host interface circuit 4240. The dedicated processor 4210 may operate in accordance with control of the host processor 4110. For example, the dedicated processor 4210 may read data from the local memory 4230 through the local memory controller 4220 in response to a command of the host processor 4110. The dedicated processor 4210 may process data by performing an operation based on the read data. The dedicated processor 4210 may transmit the processed data to the host processor 4110 or may write the processed data in the local memory 4230.

The dedicated processor 4210 may perform operations specialized to a specific application based on a value stored in the local memory 4230. For example, the dedicated processor 4210 may perform operations specialized to applications such as an AI, a streaming analysis, video transcoding, data indexing, data encoding/decoding, and data encryption. Therefore, the dedicated processor 4210 may process various forms of data such as image data, audio data, motion data, biometric data, and a key value. For example, the dedicated processor 4210 may include at least one of the GPU, the NPU, the TPU, the VPU, the ISP, and the DSP.

The dedicated processor 4210 may include a processor core or a plurality of processor cores such as a dual core, a quad core, and a hexa core. According to an example embodiment, the dedicated processor 4210 may include a greater number of cores than the host processor 4110 for an operation specialized to parallelism. For example, the dedicated processor 4210 may include 1,000 or more cores.

The local memory controller 4220 may control an overall operation of the local memory 4230. According to an example embodiment, the local memory controller 4220 may perform error correction code (ECC) encoding and ECC decoding, may perform data verification by a cyclic redundancy check (CRC) method, or may perform data encryption and data decryption. The local memory controller 4220 may correspond to the memory controller 100 of FIG. 1.

The local memory 4230 may be exclusively used by the dedicated processor 4210. The local memory 4230 may be implemented by DRAM. However, the inventive concept is not limited thereto. For example, the local memory 4230 may be implemented by at least one of the volatile memory such as the SRAM and the non-volatile memory such as the flash memory, the PRAM, the RRAM, or the MRAM. According to an example embodiment, the local memory 4230 may be mounted on a substrate together with the dedicated processor 4210 or may be implemented in various forms such as the chip, the package, the module, the card, and the device to be connected to the dedicated processor 4210 based on a separate connector. The local memory 4230 may correspond to the memory device 200 or the stacked memory device 300 or 400 described with reference to FIGS. 1 to 13.

According to an example embodiment, the local memory 4230 may include a logic circuit capable of performing some operations. The logic circuit may perform a linear operation, a comparison operation, a compression operation, a data conversion operation, and an arithmetic operation for data read from or to be written in the local memory 4230. Therefore, a size of the data processed by the logic circuit may be reduced. When the size of the data is reduced, bandwidth efficiency between the local memory 4230 and the local memory controller 4220 may improve.

The host interface circuit 4240 may be formed so that the accelerator subsystem 4200 communicates with the host 4100. The accelerator subsystem 4200 may transmit and receive a control signal and data to and from the host 4100 through the host interface circuit 4240. According to an example embodiment, the dedicated processor 4210, the local memory controller 4220, and the host interface circuit 4240 may be implemented by one chip.

The interconnect 4300 may provide a data transmission path between the host 4100 and the accelerator subsystem 4200 and may function as a data bus or a data link. The data transmission path may be wired or wirelessly formed. The interface circuit 4140 and the host interface circuit 4240 may communicate through the interconnect 4300 based on a predetermined code. For example, the interface circuit 4140 and the host interface circuit 4240 may communicate based on one of various standards such as an advanced technology attachment (ATA), a serial ATA (SATA), an external SATA (e-SATA), a small computer small interface (SCSI), a serial attached SCSI (SAS), a peripheral component interconnection (PCI), a PCI express (PCIe), an NVM express (NVMe), an advanced extensible interface (AXI), an ARM microcontroller bus architecture (AMBA), an IEEE 1394, a universal 8 serial bus (USB), a secure digital (SD) card, a multi-media card (MMC), an embedded multi-media card (eMMC), a universal flash storage (UFS), a compact flash (CF), and a Gen-Z. Alternatively, the interface circuit 4140 and the host interface circuit 4240 may communicate based on a communication link among devices such as a coherent accelerator processor interface (openCAPI), cache coherent interconnect for accelerators (CCIX), a compute express link (CXL), and a NVLINK. Alternatively, the interface circuit 4140 and the host interface circuit 4240 may communicate based on a wireless communication technology such as a long term evolution (LTE), a 5G, an LTE-M, an NB-IoT, a LPWAN, a Bluetooth, a near field communication (NFC), a Zigbee, a Z-wave, or a WLAN.

According to an example embodiment, the accelerator subsystem 4200 may further include a sensor capable of sensing image data, audio data, motion data, biometric data, and peripheral environment information. According to an example embodiment, when the sensor is included in the accelerator subsystem 4200, the sensor may be connected to other components (e.g., the dedicated processor 4210 and the local memory 4230) based on the above-described packaging technique. The accelerator subsystem 4200 may process data sensed by the sensor based on specific operations.

In FIG. 17, it is illustrated that the dedicated processor 4210 uses one local memory 4230 through one local memory controller 4220. However, the inventive concept is not limited thereto. For example, the dedicated processor 4210 may use a plurality of local memory components through one local memory controller 4220. As another example, the dedicated processor 4210 may use local memory corresponding to each of a plurality of local memory controllers through the plurality of local memory controllers.

While the inventive concept has been particularly shown and described with reference to embodiments thereof, it will be understood that various changes in form and details may be made therein without departing from the spirit and scope of the following claims.

What is claimed is:

1. A memory device comprising:
a clock pin configured to receive a clock signal;
row pins configured to receive a first active command and a first precharge command during a first time period, and receive a second active command and a second precharge command during a second time period; and
column pins configured to receive a first column command during the first time period, and receive a second column command during the second time period,
wherein during the first time period, the row pins are configured to receive the first active command during a first sub-period and receive the first precharge command during a second sub-period which starts at a timing corresponding to a rising edge of the clock signal after receiving the first active command, and the column pins are configured to receive the first column command during a third sub-period,
wherein during the second time period, the row pins are configured to receive the second active command during a fourth sub-period and receive the second precharge command during a fifth sub-period which starts at a timing corresponding to a falling edge of the clock signal after receiving the second active command, and the column pins are configured to receive the second column command during a sixth sub-period, and
wherein each of the first sub-period and the fourth sub-period corresponds to a first number of rising edges of the clock signal and a second number of falling edges of the clock signal, and the second number is different from the first number.

2. The memory device of claim 1, wherein the first number is 2 and the second number is 1.

3. The memory device of claim 1, wherein a first minimum time interval between the first active command and the first precharge command is different from a second minimum time interval between the second active command and the second precharge command.

4. The memory device of claim 3, wherein the first minimum time interval is greater than the second minimum time interval by a half (0.5) cycle of the clock signal.

5. The memory device of claim 1, wherein a number of row pins is 10 and a number of column pins is 8.

6. The memory device of claim 1, wherein the memory device is configured to communicate with an external host device based on a high bandwidth memory (HBM) interface.

7. The memory device of claim 1, wherein each of the first column command and the second column command is a read command or a write command.

8. The memory device of claim 1, wherein a length of each of the second sub-period and the fifth sub-period is a half (0.5) cycle of the clock signal.

9. A memory controller comprising:
a clock pin configured to transmit a clock signal to a memory device;
row pins configured to transmit a first active command for the memory device and a first precharge command for the memory device during a first time period, and transmit a second active command for the memory device and a second precharge command for the memory device during a second time period; and
column pins configured to transmit a first column command for the memory device during the first time period, and transmit a second column command for the memory device during the second time period,
wherein during the first time period, the row pins are configured to transmit the first active command to the memory device during a first sub-period and transmit the first precharge command to the memory device during a second sub-period which starts at a timing corresponding to a rising edge of the clock signal after transmitting the first active command, and the column pins are configured to transmit the first column command to the memory device during a third sub-period, and
wherein during the second time period, the row pins are configured to transmit the second active command to the memory device during a fourth sub-period and transmit the second precharge command to the memory device during a fifth sub-period which starts at a timing corresponding to a falling edge of the clock signal after transmitting the second active command, and the column pins are configured to transmit the second column command to the memory device during a sixth sub-period, and
wherein each of the first sub-period and the fourth sub-period corresponds to a first number of rising edges of the clock signal and a second number of falling edges of the clock signal, and the second number is different from the first number.

10. The memory controller of claim 9, wherein the first number is 2 and the second number is 1.

11. The memory controller of claim 9, wherein a first minimum time interval between the first active command and the first precharge command is different from a second minimum time interval between the second active command and the second precharge command.

12. The memory controller of claim 11, wherein the first minimum time interval is greater than the second minimum time interval by a half (0.5) cycle of the clock signal.

13. The memory controller of claim 9, wherein each of the first column command and the second column command is a read command or a write command.

14. The memory controller of claim 9, wherein a length of each of the second sub-period and the fifth sub-period is a half (0.5) cycle of the clock signal.

15. A memory system comprising:
a package substrate;
an interposer stacked on the package substrate;
a memory device stacked on the interposer, the memory device including a clock pin, row pins and column pins; and
a memory controller stacked on the interposer, the memory controller configured to transmit a first row command to the memory device during a first time period, transmit a second row command to the memory device during a second time period, and transmit a clock signal to the memory device,
wherein the interposer is configured to connect the memory device to the memory controller,
wherein the memory device is configured to decode the first row command received through the row pins during the first time period, and decode the second row command received through the row pins during the second time period,
wherein the first row command is transmitted during a first sub-period which starts at a timing corresponding to a rising edge of the clock signal,
wherein the second row command is transmitted during a second sub-period which starts at a timing corresponding to a falling edge of the clock signal, and
wherein the first row command corresponds to a first precharge command and the second row command corresponds to a second precharge command.

16. The memory system of claim 15, wherein during the first time period, the memory device is configured to receive a first active command through the row pins during a third sub-period, and receive the first precharge command during the first sub-period after receiving the first active command, and
wherein during the second time period, the memory device is configured to receive a second active command through the row pins during a fourth sub-period, and receive the second precharge command during the second sub-period after receiving the second active command,
wherein each of the third sub-period and the fourth sub-period corresponds to a first number of rising edges of the clock signal and a second number of falling edges of the clock signal, and the second number is different from the first number.

17. The memory system of claim 16, wherein during the first time period, the memory device is further configured to receive a first column command through the column pins during a fifth sub-period, and
wherein during the second time period, the memory device is further configured to receive a second column command through the column pins during a sixth sub-period.

18. The memory system of claim 16, wherein the first number is 2 and the second number is 1.

19. The memory system of claim 17, wherein each of the first column command and the second column command is a read command or a write command.

20. The memory system of claim 15, wherein a length of each of the first sub-period and the second sub-period is a half (0.5) cycle of the clock signal.

* * * * *